(12) United States Patent
Kasztelan et al.

(10) Patent No.: US 12,211,761 B2
(45) Date of Patent: Jan. 28, 2025

(54) PROTECTOR CAP FOR PACKAGE WITH THERMAL INTERFACE MATERIAL

(71) Applicant: Infineon Technologies Austria AG, Villach (AT)

(72) Inventors: Christian Kasztelan, Penang (MY); Nee Wan Khoo, Melaka (MY)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 18/235,104

(22) Filed: Aug. 17, 2023

(65) Prior Publication Data

US 2023/0395442 A1     Dec. 7, 2023

Related U.S. Application Data

(62) Division of application No. 17/175,967, filed on Feb. 15, 2021, now Pat. No. 11,769,701.

(30) Foreign Application Priority Data

Feb. 27, 2020  (EP) ..................... 20159838

(51) Int. Cl.
| H01L 21/56 | (2006.01) |
| H01L 23/04 | (2006.01) |
| H01L 23/31 | (2006.01) |
| H01L 23/367 | (2006.01) |
| H01L 23/495 | (2006.01) |

(52) U.S. Cl.
CPC ............ *H01L 23/041* (2013.01); *H01L 21/56* (2013.01); *H01L 23/3107* (2013.01); *H01L 23/367* (2013.01); *H01L 23/495* (2013.01)

(58) Field of Classification Search
CPC . H01L 23/041; H01L 23/3107; H01L 23/367; H01L 23/495
See application file for complete search history.

(56) References Cited

U.S. PATENT DOCUMENTS

| 5,767,447 A | 6/1998 | Dudderar et al. |
| 6,020,597 A | 2/2000 | Kwak |
| 6,867,484 B2 | 3/2005 | Nakajima et al. |
| 7,049,688 B2 | 5/2006 | Teshima et al. |

(Continued)

FOREIGN PATENT DOCUMENTS

| DE | 102005026224 A1 | 12/2006 |
| EP | 0393757 B1 | 10/1990 |
| EP | 2347970 B1 | 6/2013 |

OTHER PUBLICATIONS

Tian, Da-Lei, et al., "Novel packaging materials and thermal management of high-power LED packaging", http://www.cnki.net, Electronic Components and Materials, vol. 26, No. 8, Aug. 2007, pp. 1-5.

*Primary Examiner* — Eugene Lee
(74) *Attorney, Agent, or Firm* — Murphy, Bilak & Homiller, PLLC

(57) ABSTRACT

A method of manufacturing a package includes mounting an electronic component on an electrically conductive carrier, encapsulating part of the carrier and the electronic component by an encapsulant, covering an exposed surface portion of the carrier with an electrically insulating and thermally conductive interface structure, and covering at least part of the interface structure by a protection cap.

8 Claims, 11 Drawing Sheets

(56) References Cited

U.S. PATENT DOCUMENTS

| | | | |
|---|---|---|---|
| 8,404,768 B2* | 3/2013 | Ramasamy | H01L 23/4275 |
| | | | 524/404 |
| 9,397,018 B2 | 7/2016 | Otremba et al. | |
| 9,601,408 B2 | 3/2017 | Saito et al. | |
| 2001/0045297 A1 | 11/2001 | Miller et al. | |
| 2002/0158333 A1 | 10/2002 | Teshima | |
| 2003/0006501 A1 | 1/2003 | Waki et al. | |
| 2003/0042618 A1 | 3/2003 | Nose et al. | |
| 2004/0061206 A1 | 4/2004 | Son et al. | |
| 2004/0089928 A1 | 5/2004 | Nakajima et al. | |
| 2005/0256241 A1 | 11/2005 | Sachdev et al. | |
| 2006/0165978 A1 | 7/2006 | Ito et al. | |
| 2007/0270536 A1 | 11/2007 | Sachdev et al. | |
| 2011/0135911 A1* | 6/2011 | Maenaka | B32B 15/04 |
| | | | 428/327 |
| 2014/0091461 A1 | 4/2014 | Shen | |
| 2014/0367840 A1 | 12/2014 | Eu et al. | |
| 2015/0102479 A1 | 4/2015 | Fuergut et al. | |
| 2016/0358839 A1* | 12/2016 | Kuczynski | B29C 48/2886 |
| 2016/0372399 A1* | 12/2016 | Fuergut | H01L 23/4334 |
| 2017/0098598 A1 | 4/2017 | Otremba et al. | |
| 2017/0117208 A1 | 4/2017 | Kasztelan et al. | |
| 2017/0271229 A1 | 9/2017 | Santos et al. | |
| 2018/0079946 A1* | 3/2018 | Bruzda | H01L 23/4275 |
| 2018/0204751 A1 | 7/2018 | Gallagher et al. | |
| 2018/0286788 A1 | 10/2018 | Iso | |
| 2019/0013291 A1* | 1/2019 | Strader | H01L 24/97 |
| 2019/0109064 A1* | 4/2019 | Kao | H01L 23/49586 |
| 2019/0267253 A1 | 8/2019 | Stathakis et al. | |
| 2019/0304858 A1 | 10/2019 | Scharf et al. | |
| 2020/0144162 A1 | 5/2020 | Chaowasakoo et al. | |

\* cited by examiner

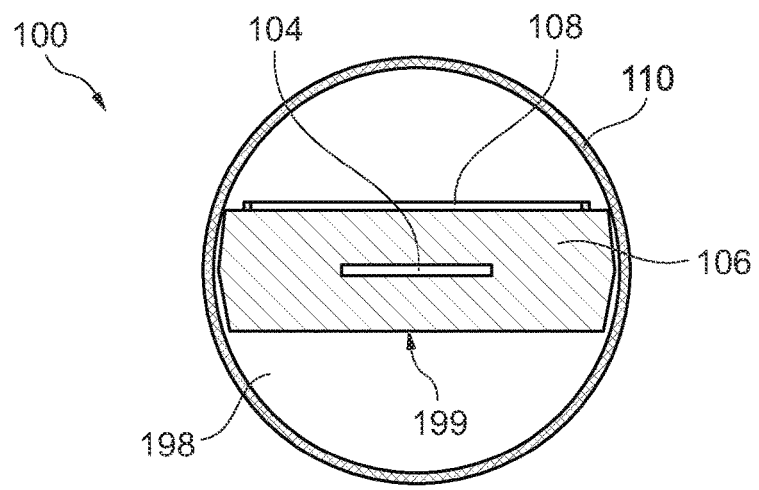
Fig. 7
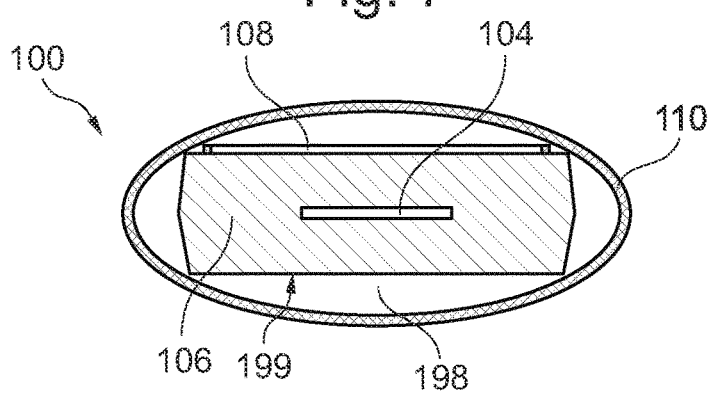
Fig. 8
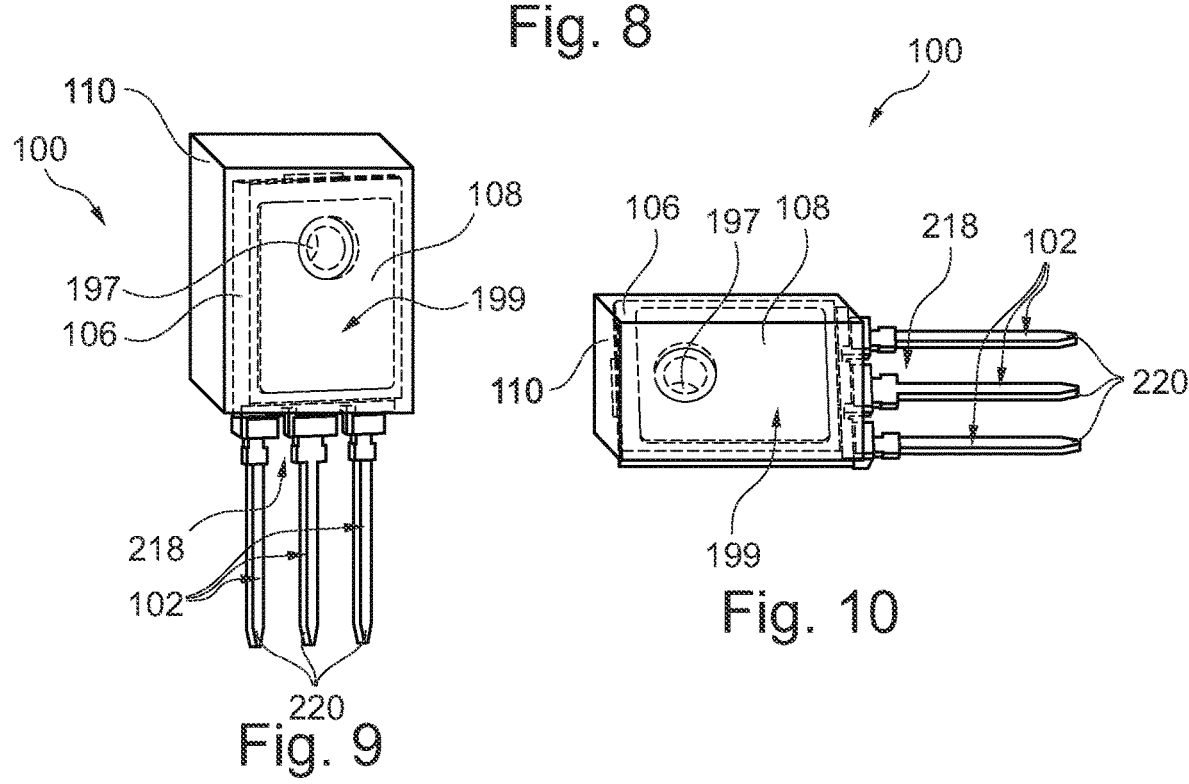
Fig. 9
Fig. 10

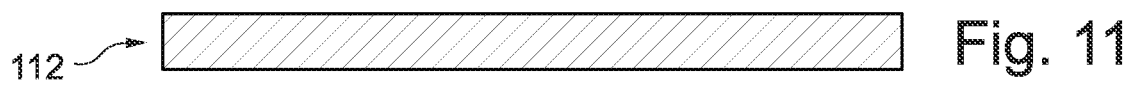
Fig. 11
Fig. 12
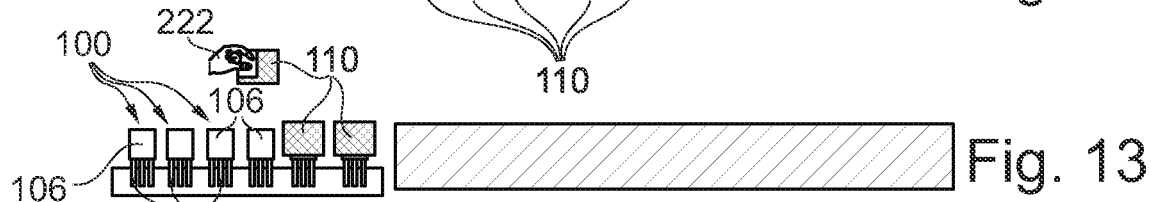
Fig. 13
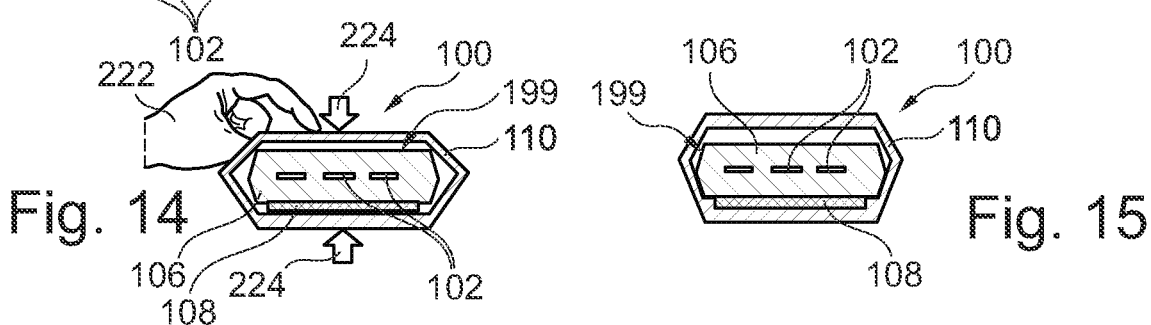
Fig. 14
Fig. 15
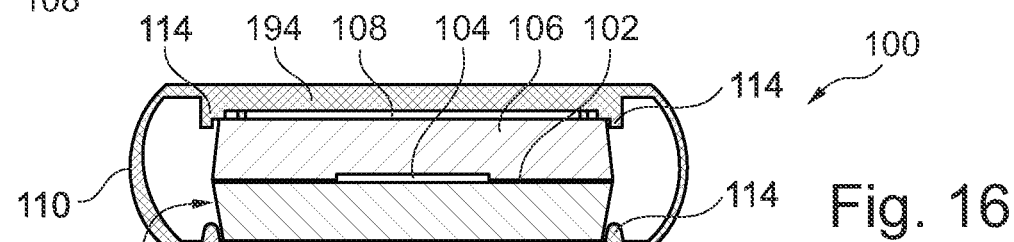
Fig. 16
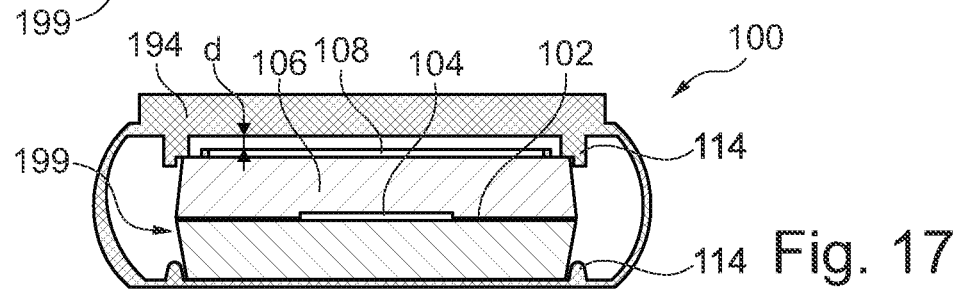
Fig. 17
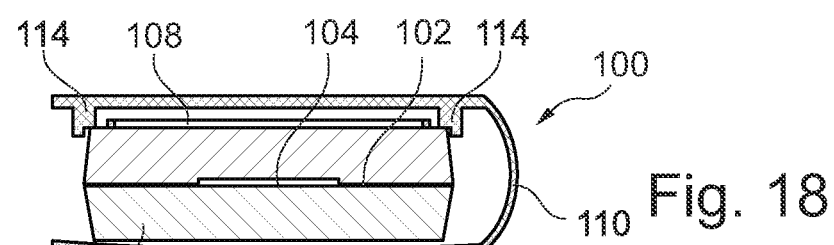
Fig. 18
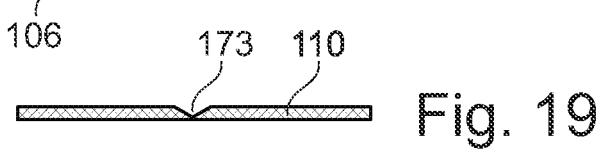
Fig. 19

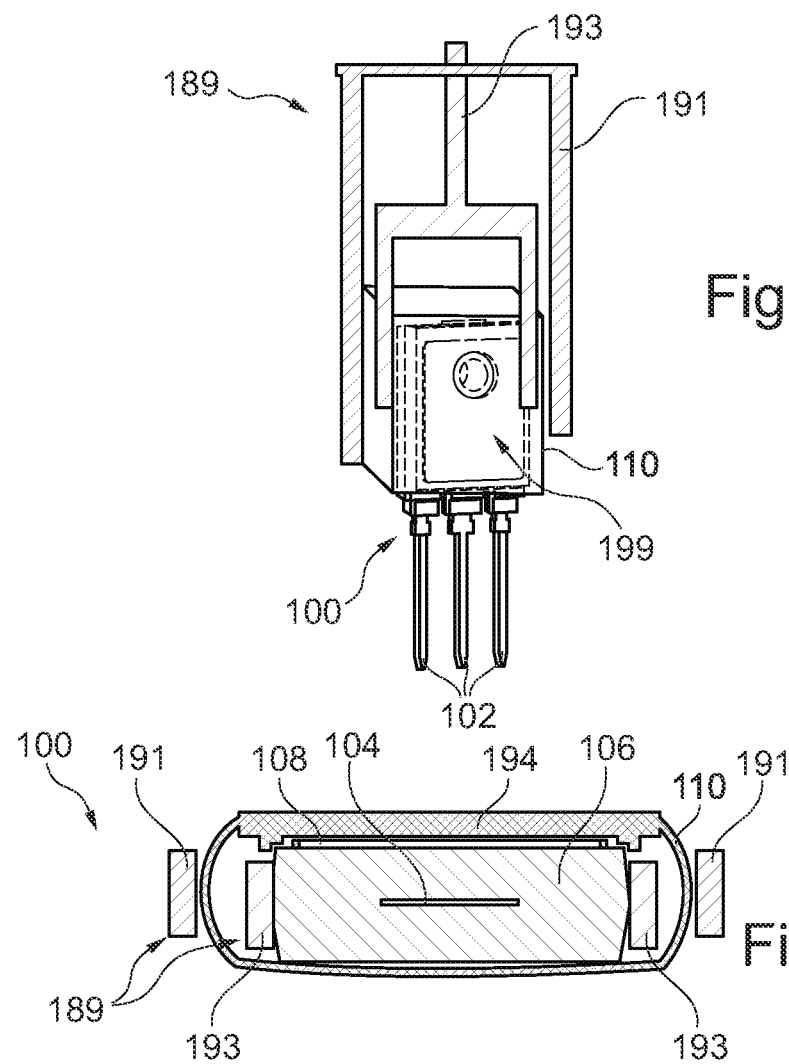
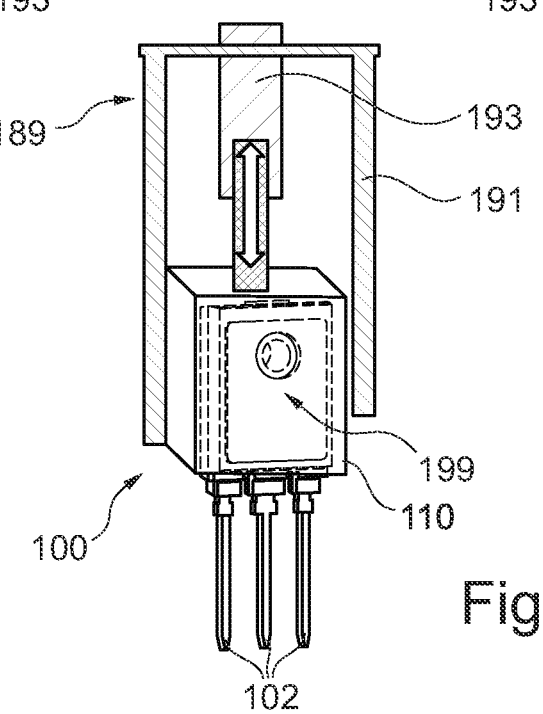
Fig. 36
Fig. 37
Fig. 38

PROTECTOR CAP FOR PACKAGE WITH THERMAL INTERFACE MATERIAL

TECHNICAL FIELD

Various embodiments relate generally to a package, a method of manufacturing a package, and a method of operating a package.

BACKGROUND

A conventional electronic component mounted on a chip carrier such as a leadframe, electrically connected by a bond wire extending from the chip to the chip carrier and molded within a package may suffer from its thermal insulation within the package. Furthermore, such a conventional approach can reach its limits when complex electronic circuits shall be established.

For discrete Transistor Outline (TO) packages and other types of packages, the operation performance is limited in general by the amount of heat, which can be transferred to a cooling unit (such as a heat dissipation body) on board level. Therefore, thermal interface materials (TIM) are used as interface material between TO package (copper surface) and cooling unit.

However, TIM material is prone to damage, for instance by scratching. This limits reliability of packages.

SUMMARY

There may be a need to provide a possibility to manufacture packages with a simple processing architecture and with a high reliability.

According to an exemplary embodiment, a package is provided which comprises an electrically conductive carrier, an electronic component on the carrier, an encapsulant encapsulating part of the carrier and the electronic component, an electrically insulating and thermally conductive interface structure covering an exposed surface portion of the carrier, and a protection cap partially or entirely covering the interface structure.

According to another exemplary embodiment, a method of manufacturing a package is provided, wherein the method comprises mounting an electronic component on an electrically conductive carrier, encapsulating part of the carrier and the electronic component by an encapsulant, covering an exposed surface portion of the carrier with an electrically insulating and thermally conductive interface structure, and partially or entirely covering the interface structure by a protection cap.

According to still another exemplary embodiment, a method of operating a package having the above-mentioned features is provided, wherein the method comprises sliding the protection cap over the interface structure for protecting the interface structure before use of the package, and later removing the protection cap from the interface structure for exposing the interface structure for use of the package.

According to an exemplary embodiment, a mechanically robust package is provided having an exposed electrically insulating and thermally conductive interface structure for promoting efficient heat removal of an encapsulated electronic component while ensuring a dielectric decoupling of the encapsulated electronic component from the environment. Electrically insulating and thermally conductive interface structures (in particular TIMs, thermal interface materials) may significantly contribute to a high thermal and electric reliability of the package but are prone to mechanical damage such as scratching. According to exemplary embodiment, an efficient damage protection of an exposed surface of an electrically insulating and thermally conductive interface structure of said package may be provided in form of a protection cap which can be slid over a package body with the interface structure so as to temporarily and at least partially cover or shield the mechanically sensitive interface structure. For instance, a tubular protection cap may be manufactured with low effort and may provide an efficient and easy to handle temporary mechanical protection for an interface structure by being mounted around a discrete package. Thus, a simply manufacturable and easily manageable protection cap may be provided for effectively protecting an isolation package against mechanical damage.

In the following, further exemplary embodiments of the package and the methods will be explained.

In the context of the present application, the term "package" may particularly denote an electronic device which may comprise one or more electronic components mounted on a carrier, said carrier to comprise or consist out of a single part, multiple parts joined via encapsulation or other package components, or a subassembly of carriers. Said constituents of the package may be encapsulated at least partially by an encapsulant. Optionally, one or more electrically conductive interconnect bodies (such as bond wires and/or clips) may be implemented in a package, for instance for electrically coupling the electronic component with the carrier.

In the context of the present application, the term "electronic component" may in particular encompass a semiconductor chip (in particular a power semiconductor chip), an active electronic device (such as a transistor), a passive electronic device (such as a capacitance or an inductance or an ohmic resistance), a sensor (such as a microphone, a light sensor or a gas sensor), an actuator (for instance a loudspeaker), and a microelectromechanical system (MEMS). In particular, the electronic component may be a semiconductor chip having at least one integrated circuit element (such as a diode or a transistor) in a surface portion thereof. The electronic component may be a naked die or may be already packaged or encapsulated. Semiconductor chips implemented according to exemplary embodiments may be formed in silicon technology, gallium nitride technology, silicon carbide technology, etc.

In the context of the present application, the term "encapsulant" may particularly denote a substantially electrically insulating material surrounding at least part of an electronic component and at least part of a carrier to provide mechanical protection, electrical insulation, and optionally a contribution to heat removal during operation.

In the context of the present application, the term "carrier" may particularly denote a support structure (which may be at least partially electrically conductive) which serves as a mechanical support for the one or more electronic components, and which may also contribute to the electric interconnection between the electronic component(s) and the periphery of the package. In other words, the carrier may fulfil a mechanical support function and an electric connection function. A carrier may comprise or consist of a single part, multiple parts joined via encapsulation or other package components, or a subassembly of carriers.

In the context of the present application, the term "interface structure" may particularly denote any physical structure forming an interface between a package and an environment thereof. More specifically, an interface material may be any material that is inserted between carrier and/or encapsulant of the package on the one hand and a further body from an electronic environment (such as a heat sink) of the package on the other hand in order to enhance the thermal coupling between them while disabling conduction of current in between. Such an interface structure may be a thermal interface material (TIM) being electrically insulating and providing proper thermal conductivity. Thus, a TIM may contribute to heat dissipation, in which the TIM may be inserted between the package as heat-producing device and a heat-dissipating device (such as a heat sink). For instance, an interface structure may be a thermal grease, a thermal adhesive, a thermal gap filler, a thermally conductive pad, a thermal tape, etc. More generally, an interface structure may be in particular any soft insulation material or thermal interface material covering a carrier of a package.

In the context of the present application, the term "protection cap" may particularly denote a cap-type physical body which may at least temporarily protect a package body or part thereof against damage. In particular, a protection cap may be shaped and dimensioned for being slidable or clampable over a package for at least partially covering an exposed surface of package. Such a protection cap may be made of a material having a sufficient robustness for withstanding mechanical load as typically occurring during handling a package, for instance in terms of handling it in preparation of an assembly of the package on a mounting base such as a printed circuit board (PCB). For instance, the protection cap may be configured for withstanding mechanical load as occurring during manual handing by an operator or during handling by a pick-and-place device.

In an embodiment, the carrier, the electronic component, the encapsulant and the interface structure may form a package body onto which the protection cap may be at least partially attached for covering at least a part of the surface of the package body, in particular at least a part of the surface of its interface structure. Optionally, the package body may comprise one or more further elements of the package.

In an embodiment, the protection cap is configured for being removable from the interface structure. In particular, the protection cap may be reversibly attachable to the package body and detachable from the package body. Thus, the protection cap may be configured to function as a temporary protection which can be removed by being pulled or detached in any other manner by a human operator or by a pick-and-place device. Thus, it may be sufficient to simply slide the protection cap over the package body to initiate protection, and to later detach the protection cap from the package for further processing or using the package (for instance for attaching the interface structure to a heat dissipation body such as a heat sink).

In another embodiment, the protection cap is (in particular irremovably without destruction) fixed on the package body, in particular is molded on the package body or is formed by coating or immersing in a liquid precursor of the protection cap. In such an embodiment, an integral connection between protection cap and interface structure may be formed, for instance by molding the protection cap around at least part of the package. It is also possible that the protection cap is formed by dipping the package into a liquid medium which may then be hardened to thereby form the protection cap. In such embodiments, removal of the protection may be carried out for instance chemically, by dissolving the integral protection cap to thereby expose the interface structure. It is also possible to remove such an interface structure for use of the package by cracking the protection structure.

In an embodiment, the protection cap additionally covers at least part of the encapsulant. In particular, it is possible that the protection cap at least covers the entire interface structure and preferably also a surrounding portion of the encapsulant, for instance an annular surrounding of the interface structure. This may ensure that no undesired electrically conductive paths are formed from an environment of the package into an interior thereof, in particular up to the encapsulated electronic component.

In an embodiment, the protection cap comprises or consists of an electrically insulating material. For instance, the protection cap may be made of plastic, cardboard or paper. By configuring the protection cap from a dielectric material, any undesired electric paths up to the package may be disabled.

In an embodiment, a wall thickness of at least part of the protection cap on the interface structure is larger than another wall thickness of another part of the protection cap on the encapsulant. By taking this measure, the usually mechanically most sensitive portion of the package, i.e. the interface structure, may be protected with specific care and reliability.

In an embodiment, a guide structure for guiding the encapsulant (or more generally the package body) within the protection cap is formed in an interior of the protection cap. For instance, such a guide structure may be constituted by one or more physical structures protruding from an interior wall of the protection cap inwardly for engaging the package body. This may ensure that a mounting process of mounting the protection cap on the package body (in particular on the encapsulant and the interface structure) is carried out in a predefined way, in particular along a predefined trajectory. This may, in turn, prevent damage which may be caused by a misuse of the protection cap, and which may for instance scratch the sensitive interface structure. The mentioned guide structure may guide the package body into an accommodation volume in an interior of the protection cap along a target path up to a target position. When being guided by the guide structure, the interface structure may be in particular prevented from any physical contact with an interior of the protection cap, so that scratching may be efficiently prevented. Preferably, the guide structure may be integrally formed with the rest of the protection cap, for instance by extrusion.

In an embodiment, the protection cap fully circumferentially surrounds the encapsulant and the interface structure, in particular is configured as a circumferentially closed sleeve. In other words, the protection cap may fully surround a lateral surface of the package body in an annular way. In one embodiment, such an annular sleeve of the protection cap may be open at the top side and at the bottom side. Such a protection cap may be manufacturable with very small effort, for instance by extrusion and cutting. In another embodiment, the protection cap may circumferentially surround the package body and may be open at the bottom side and closed at the top side. The closed top side may then serve as an abutment surface abutting on a flange face of the package body when the protection cap is properly mounted thereon.

In another embodiment, the protection cap only partially circumferentially surrounds the encapsulant and the interface structure, in particular is configured as a circumferentially open clip. In such an embodiment, it is for instance possible that the protection cap is substantially U-shaped or substantially C-shaped and is laterally clamped around only a part of the lateral surface of the protection body. With such a configuration, the protection cap may be manufactured with very low material consumption and thus with very small effort.

In an embodiment, the electrically insulating and thermally conductive interface structure is attached at an external surface to a heat dissipation body after removing the protection cap. For example, such a heat dissipation body may be a heat sink with a thermally highly conductive plate to be attached to the interface structure and cooling fins extending from said plate. In such an embodiment, a thermal path of removing heat created in an interior of the package may be from an encapsulated electronic component (being a heat source), via the carrier and the interface structure up to the heat dissipation body. The temporary protection cap may ensure that the interface structure maintains intact until it is brought in physical contact with the heat sink to thereby allow for an efficient cooling of the package.

In an embodiment, the protection cap is made of a deformable material, in particular of an elastically deformable material. In such an advantageous configuration, a user may use his fingers (or an actuator of a pick-and-place device may be controlled) for temporarily deforming the protection cap to temporarily shape it so that it assumes a deformed condition in which it can be slid over the package body. Thereafter, the deformed protection cap may be pulled over the package body. Further subsequently, the deformation force exerted on the protection cap may be released, so that the protection cap moves back into its force free configuration and is thereby clamped onto the package body. In this condition, the protection cap is secured on the package body. For subsequently removing the protection cap from the package body, the operator or pick-and-place device may exert against an elastic deformation force so that the protection cap may be easily removed from the package body.

In an alternative configuration, it is also possible that the protection cap is made of a plastically deformable material. After having placed the protection cap over the package body, a plastic deformation force may be applied for fastening or securing the protection cap at the package body. For removing such a plastically deformed protection cap from the package body, it may be expanded (for instance by breaking it) by applying an expansion force exerted by the operator or a pick-and-place device.

In an embodiment, the protection cap covers the interface structure without physical contact to the interface structure. While being covered in a touchless by the protection cap, the interface structure may be fully prevented from any contact which might cause a scratch.

In another embodiment, the protection cap covers the interface structure with physical contact, in particular with physical contact to substantially the entire interface structure. In particular in case of a full surface contact between interface structure and an interior wall of the protection cap, any mechanical pressure in between may be reliably distributed over a large area. Consequently, an excessive force applied to the interface structure may be reliably avoided.

In an embodiment, the protection cap comprises or consists of a metal, such as aluminum or copper. A metallic protection cap, such as a protection cap made of aluminum or copper, may have a very high thermal conductivity. Thus, the protection cap itself may serve as a heat sink (in particular as an additional or second heat sink) contributing to the removal of heat out of an interior package. In particular when the protection cap is made of metal, it may be also possible that the protection cap remains permanently connected to the package body even during use of the package. Such a permanently assembled protection cap may serve as a heat spreader. Optionally, a thermal grease may be provided between an exterior wall of such a permanently assembled protection cap and a heat sink connected to such an exterior wall.

In another embodiment, the protection cap comprises or consists of plastic. In such an embodiment, the protection cap may serve as a relatively soft protection body for protecting the interface structure from scratches. Before use, such a temporary protection cap may be preferably removed from the package body to thereby expose the interface structure to an environment.

In an embodiment, the protection cap has a predetermined breaking point configured for breaking when applying a braking force to the protection cap. For example, such a predetermined breaking point may be a locally thinned or mechanically weakened portion of the protection cap at which breakage of the protection cap occurs in the presence of an exterior applied mechanical force. By making sure that the protection cap always breaks at a predetermined position, a breaking procedure for removing the protection cap (for instance before use of the package) may be automated and may be rendered reproducible.

In an embodiment, the protection cap is configured for thermally triggering assembly of the protection cap on the package (or package body) and/or disassembly of the protection cap from the package (or package body). In other words, the external application of a certain temperature to the protection cap (in particular including the package body therein) may transfer the protection cap into an assigned assembly configuration or a disassembly configuration. Also such an embodiment allows to automate assembly and disassembly, for instance by a temperature adjustment unit in collaboration with a robot.

In an embodiment, the protection cap comprises a removal trigger structure, in particular one of a tab and a zipper, configured for triggering removal of the protection cap from the package. By actuating said removal trigger structure, an operator, a robot or any other entity may easily disassemble the protection cap for exposing the package body, for instance before assembly or use of the package.

In an embodiment, the package comprises a further electrically insulating and thermally conductive interface structure and a further carrier, the further interface structure covering an exposed surface portion of the further carrier. The protection cap may cover at least part of the further interface structure. In other words, the package may be configured for double-sided cooling. A single protection cap may cover both interface structures in an efficient way.

In an embodiment, the interface structure is made of a soft material. In order to provide the interface structure with soft material properties, the material of the interface structure may have a compressibility in a range between 1% and 20% (which may be measured by applying a 1 N force at a layer of the interface structure having a thickness of 250 μm using a Vickers-micro-indentor), in particular in a range between 5% and 15%. When the interface structure is then brought in contact with a heat sink, the soft material properties of the interface structure ensure a proper full-surface contact and thus an efficient heat transfer from interface structure to heat sink. In particular, it may be sufficient to directly connect the thermal interface structure with the heat sink using a connection screw or the like, and in particular without the need of thermal grease in between the thermal interface structure and the heat sink. Although such soft material properties of the interface structure render the latter prone to scratching, the provision of a protection cap protects the interface structure and ensures a proper functionality of the package.

In an embodiment, the method comprises separating a tube (or oblong tubular sleeve) into multiple protection caps and using each separated protection cap for an assigned package. For instance, such a tube may be manufactured in a simple and efficient way of a plastic material and may be subsequently be cut into multiple tubular pieces. Each of said pieces may be used as protection cap for an assigned package. By taking this measure, a very simple manufacture of the protection caps is possible.

In an embodiment, the method comprises forming the protection cap by extruding. Extrusion may denote a process used to create protection caps or preforms thereof of a fixed cross-sectional profile. In this context, a material may be pushed through an extrusion tool of the desired cross-section. After obtaining an endless tubular body by extrusion, said body may be separated into multiple protection caps by cutting or chopping it into multiple tubular pieces. This method allows manufacturing the protection caps in a quick way.

In an alternative embodiment, the method comprises overmolding the interface structure with a mold-type protection cap. As a result, a protection cap may be obtained which is integrally formed with the package body. Such a protection cap may be removed chemically (for instance by selective etching), or by cracking it by applying a mechanical force.

In an embodiment, the sliding comprises sliding the protection cap not only over the interface structure, but also over the encapsulant. Correspondingly, the removing may comprise removing the protection cap not only from the interface structure, but also from the encapsulant. Thus, the process of assembling the protection cap on the package body and the process of removing the protection cap from the package body may be inverse, and preferably also reversible. This may simplify handling of the package body together with protection cap. Removing the protection cap from the package body by sliding it away from the package body may occur before assembling and using the package without protection cap on a mounting base (such as a printed circuit board, PCB). The detached protection cap may be reused for temporarily protecting another package body.

In an embodiment, the method comprises applying (in particular manually) a squeezing force to the protection cap before the sliding, and removing the squeezing force after the sliding to thereby fix the protection cap at the package body. Squeezing for mounting the protection cap on the package body and for demounting the protection cap from the package body is a simple and intuitive process and simultaneously allows to carry out assembly and disassembly processes in a quick way. Descriptively speaking, squeezing may bring the preferably elastic protection cap into a shape in which it fits over a package body. By releasing a squeezing force applied to the for instance sleeve-shaped protection cap after having placed it over the package body may trigger a motion of the squeezed protection cap into its initial force-free shape in which it may engage the package body in a gripping or clamping way.

In an embodiment, the interface structure is formed by at least one of the group consisting of molding, in particular compression molding or transfer molding, stencil printing, and laminating. Thus, such manufacturing methods may promote the formation of an integral thermal interface which may also intermingle with carrier and/or encapsulant. It is alternatively possible to manufacture the interface structure with a generative or an additive (for instance software controlled) manufacturing procedure such as printing, in particular three-dimensional printing. Alternatively, attachment of a thermal interface foil on the remainder of the package body is possible as well. By molding or laminating, the thermal interface structure may be connected to the remainder of the package by the application of pressure and heat, optionally under vacuum, preferably accompanied by a curing reaction.

In an embodiment, a through hole extends at least through the encapsulant and the interface structure so that a fastening element (such as a screw or a bolt) is guidable through the through hole for fastening the package to a heat sink (for instance a heat dissipation body). In an embodiment, the fastening element may form part of the package. Mounting the package to the heat dissipation body by a fastening element such as a screw is simple and cheap.

In an embodiment, the package comprises a clip configured for connecting the package to a heat dissipation body. Such a clip may be configured to clamp the encapsulated chip-carrier arrangement with thermal interface coating against the heat dissipation body without the need to form a through hole. Although the effort for connecting a heat dissipation body to the rest of the package by a clip is somewhat higher than by a fastening element such as screw, it is nevertheless advantageous in particular for high-performance applications.

As an alternative to a screw or clip connection, other fastening techniques may be applied (such as another clamping technique).

Thermal conductivity of the thermally conductive material of the interface structure may be higher than thermal conductivity of the material of the encapsulant. For instance, thermal conductivity of the material of the encapsulant may be in a range between 0.8 W m$^{-1}$ K$^{-1}$ and 8 W m$^{-1}$ K$^{-1}$, in particular in a range between 2 W m$^{-1}$ K$^{-1}$ and 4 W m$^{-1}$ K$^{-1}$. For example, the material of the interface structure may be a silicone-based material (or may be made on the basis of any other resin-based material, and/or combinations thereof) which may comprise filler particles for improving thermal conductivity. For example, such filler particles may comprise or consist of aluminium oxide (and/or boron nitride, aluminium nitride, diamond, silicon nitride). For the thermally conductive interface structure, values of the thermal conductivity of at least 10 W m$^{-1}$ K$^{-1}$ may be obtained, in particular values in a range between 20 W m$^{-1}$ K$^{-1}$ and 30 W m$^{-1}$ K$^{-1}$.

In an embodiment, the carrier comprises or consists of a leadframe. A leadframe may be a metal structure inside a chip package that is configured for carrying signals from the electronic component to the outside, and/or vice versa. The electronic component inside the package may be attached to the leadframe, and then bond wires may be provided for attach pads of the electronic component to leads of the leadframe. Subsequently, the leadframe may be molded in a plastic case or any other encapsulant. Outside of the leadframe, a corresponding portion of the leadframe may be cut-off, thereby separating the respective leads. Before such a cut-off, other procedures such a plating, final testing, packing, etc. may be carried out, as known by those skilled in the art. Leadframe or chip carrier can be coated before encapsulation, for instance by an adhesion promoter.

In another embodiment, the carrier comprises a stack composed of a central electrically insulating and thermally conductive layer (such as a ceramic layer) covered on both opposing main surfaces by a respective electrically conductive layer (such as a copper layer or an aluminium layer, wherein the respective electrically conductive layer may be a continuous or a patterned layer), a Direct Copper Bonding (DCB) substrate, and a Direct Aluminium Bonding (DAB) substrate.

In an embodiment, the package further comprises the above-mentioned heat dissipation body attached or to be attached to the exposed interface structure for dissipating heat generated by the electronic component during operation of the package. For example, the heat dissipation body may be a plate of a properly thermally conductive body, such as copper or aluminium or graphite, diamond, composite material and/or combinations of the mentioned and/or other materials, which may have cooling fins or the like to further promote dissipation of heat which can be thermally conducted from the electronic component via the chip carrier and the interface structure to the heat dissipation body. The removal of the heat via the heat dissipation body may further be promoted by a cooling fluid such as air or water (more generally a gas and/or a liquid) which may flow along the heat dissipation body externally of the package. Also heat pipes may be implemented.

In an embodiment, the package is adapted for double-sided cooling. For example, a first interface structure may thermally couple the encapsulated chip and carrier with a first heat dissipation body, whereas a second interface structure may thermally couple the encapsulated chip and carrier with a second heat dissipation body. When the protection cap covers such a package body with double sided cooling, the protection cap may cover in particular both interface structures.

In an embodiment, the electronic component is configured as a power semiconductor chip. Thus, the electronic component (such as a semiconductor chip) may be used for power applications for instance in the automotive field and may for instance have at least one integrated insulated-gate bipolar transistor (IGBT) and/or at least one transistor of another type (such as a MOSFET, a JFET, etc.) and/or at least one integrated diode. Such integrated circuit elements may be made for instance in silicon technology or based on wide-bandgap semiconductors (such as silicon carbide). A semiconductor power chip may comprise one or more field effect transistors, diodes, inverter circuits, half-bridges, full-bridges, drivers, logic circuits, further devices, etc.

As substrate or wafer forming the basis of the electronic components, a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

For the encapsulating, a plastic material or a ceramic material may be used.

Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments and constitute a part of the specification, illustrate exemplary embodiments.

In the drawings:

FIG. 3 to FIG. 8 illustrate different views of packages with reversibly attachable and detachable protection cap according to exemplary embodiments.

FIG. 9 and FIG. 10 illustrate different views of a package with overmolded protection cap according to another exemplary embodiment.

FIG. 11 to FIG. 15 illustrate different views of structures obtained during carrying out a method of manufacturing a package with protection cap according to still another exemplary embodiment.

FIG. 16 illustrates a package body covered by a protection cap with a locally thickened protection wall in physical contact with an interface structure according to an exemplary embodiment.

FIG. 17 illustrates a package body covered by a protection cap with a locally thickened protection wall being arranged in a touchless way with respect to an interface structure according to an exemplary embodiment.

FIG. 18 illustrates a package body covered only along a part of its circumference by a protection cap according to an exemplary embodiment.

FIG. 19 illustrates part of a protection cap with a predetermined breaking point according to an exemplary embodiment.

FIG. 36 to FIG. 39 illustrate protection caps according to an exemplary embodiment during automated robot handling.

DETAILED DESCRIPTION

Figure 1:
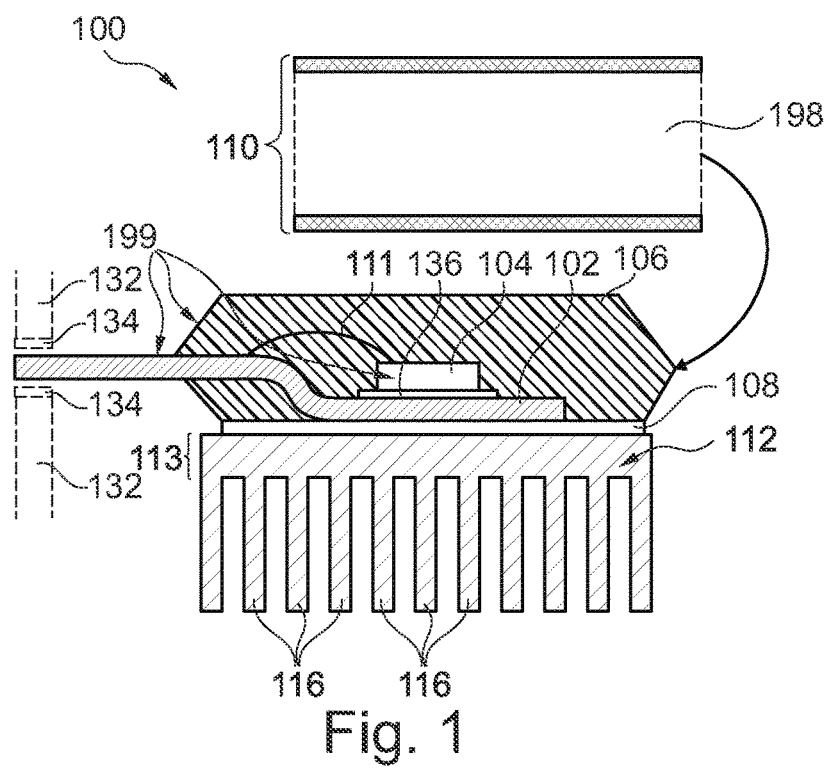
FIG. 1 illustrates a cross-sectional view of a package with protection cap according to an exemplary embodiment, the package being mounted on a mounting structure and being coupled with a heat dissipation body.

The illustrations in the drawings are schematic and not to scale.

Before exemplary embodiments will be described in more detail referring to the figures, some general considerations will be summarized based on which exemplary embodiments have been developed.

In view of soft or compressive properties of thermal interface material covering exposed portions of a metallic carrier of a chip package, it may conventionally happen that users unintentionally destroy such a soft isolation, for instance during lead bending and internal transport of the package. This has conventionally rendered the use of this kind of packages with interface structure sometimes difficult in mass production.

According to an exemplary embodiment, a protection cap is provided for covering and thereby protecting at least a part of a package body which part includes an exposed thermally conductive and electrically insulating interface structure (in particular a thermal interface material, TIM). The use of such a (in particular 3-4-sided) protection cap (preferably a plastic protector, which may be made for instance by an extrusion process) may allow to protect a dedicated part of the package body from handling damage. Such a protection cap may serve as a protector structure in particular for an interface structure of a package (which may be prone to scratching). Preferably, such as a protection may be designed with at least one mechanical guiding structure to guide the package body towards a target position in the protection cap. In an embodiment, the protection cap may be deformable by an external force to allow change of its geometry for loading and/or unloading purposes. Advantageously, the protection cap or protector structure may hold the package device in place via its deformable interior properties allowing the protection cap to return in its initial force free state when releasing a squeezing force used for mounting the protection cap over the package body.

A thermal interface material (TIM) may provide excellent thermal properties to a package and may thereby contribute significantly to the dissipation of heat created by an encapsulated electronic component (for instance a power semiconductor chip) during operation of the package. However, such a thermal interface layer may require proper handling in order not to scratch the thermal interface layer, which may affect the thermal and/or dielectric performance of the package or may even cause a malfunction there. Furthermore, it may be difficult for an operator to handle unprotected packages, for instance in a less automated environment, in which packages may be handled in bulk and manual processing. Also when post processing (such as lead bending at a facility where packages are assembled on a mounting base or the like) is desired or required, there may be conventionally handling restriction due to the sensitive nature of an exposed thermal interface layer of a package.

Advantageously, the provision of a protection cap for at least temporarily protecting a thermal interface structure on an exposed surface of a package body does not involve any risk of a chemical reaction with such a thermal interface layer, which might lead to residues and/or change of the properties of the TIM. Furthermore, when the protection cap is removed from the package before use or further processing thereof, there is no risk of peeling off the protection cap from the TIM and thereby deteriorating the latter. Such a risk may be avoided for instance when the protection cap is removed from the package body by squeezing and thereafter pulling it apart from the package body. Highly advantageously, when providing a protection cap which may be secured by clamping without glue, the reliable supply of a clamping force may prevent a merely glued protection structure from dropping off the package body due to a lack of an adhesive force (for instance when packages are sliding in a packing tube). Furthermore, an advantage of a protection cap used for protecting a TIM of a package is that it can be manufactured and handled with very low effort.

A gist of an exemplary embodiment is to use a plastic cover (such as a trim from a plastic tube) as protector for a sensitive exposed package portion, such as a thermal interface material (TIM). Plastic tubes, which may be used as a preform form producing protection caps, may be manufactured using a plastic extrusion process. A target cross-sectional shape can be adjusted by correspondingly designing a dedicated extrusion plate. Subsequently, the extruded plastic tube may be cut into pieces of appropriate length, wherein each piece may be used as a protection cap for an assigned package body. In particular, a respective protection cap may be slid into a package body and act as protection cover, especially on the thermal interface layer. Once the cover-type protection cap is applied to the package body, the package can be handled freely without risk of scratch of sensitive surface portions, such as an interface structure.

Advantageously, extrusion may be used for plastic tube manufacturing, wherein said plastic tube may be cut into a plurality of tubular pieces each serving as a protection cap. This may result in a low manufacturing effort both in terms of consumed material and implemented manufacturing tools. Moreover, a sufficient precision of the dimensions of the obtained protection caps may be obtained with this manufacturing architecture. Moreover, the described manufacturing concept enables to manufacture protection caps at different sizes (in particular in terms of thickness, length and/or width).

Furthermore, the protection caps may be designed with a desired profile to enable an easy application, protection, and removal. When applied, the protection cap may be secured to an encapsulant of the package such as a package mold, thereby protecting an exposed thermal interface layer from unwanted handling. The described principle of protection caps being simply pushed or slid over a package body for protection purposes is also properly compatible with manual handling manufacturing environments, as well as with those that require post procession such as lead bending.

In yet another body embodiment, a molded protection cap covering the exposed thermal interface structure (in particular only) or covering the entire encapsulant such as a mold (for instance excluding a lead side) may be provided.

In an embodiment, the cap may be made of metal and plastic. It is possible to provide a cap which is made of a metal and covered with thermally conductive but electrically insulating material. Such a full cap or half cap may still have the function of protection of for instance a soft phase change material applied to the package exposed metal leadframe (or any other kind of carrier).

In an embodiment, a metal cap may be provided with fins and the function of a heat sink. Such a cap, which may be made of metal, may be applied but never removed. The package-heat sink-cap arrangement may allow for a mounting without additional heat sink.

Regarding the cap function, the cap may serve as protection for soft isolation or TIM materials (anti-scratch). The cap may also comprise thin but hard isolation materials (for instance 100 μm of hard mold compound).

In a preferred embodiment, a cap may be formed by dipping a package body into a liquid cap precursor. Such a precursor may have similar material properties as nail polish. Such a precursor may be liquid. It may be hardened with UV (ultraviolet radiation) and may then be hard. It may be removed with nail vanish remover.

In an embodiment, the method comprises forming the protection cap by immersion into a cap precursor. For instance, this may be carried out for simultaneously covering electrically conductive structures of the package with the cap precursor. Thus, it may be possible to use the liquid precursor for the cap in order to cover metal leads of the package, too. A motivation behind this may be to create a cheap lead-lead (for instance collector-emitter) isolation for high voltage (for instance for applications with larger than 1000 V) modules. A user may siliconize the leads after a solder connection with a mounting structure such as a PCB. By this, it may be ensured that the PCB creepage distance complies even with strict specifications. This may be applied particularly advantageously for the TO package family.

FIG. 1 illustrates a cross-sectional view of a package 100, which is embodied as a Transistor Outline (TO) package, according to an exemplary embodiment. The package 100 is mounted on a mounting structure 132, here embodied as printed circuit board.

The mounting structure 132 comprises an electric contact 134 embodied as a plating in a through hole of the mounting structure 132. When the package 100 is mounted on the mounting structure 132, an electronic component 104 of the package 100 is electrically connected to the electric contact 134 via an electrically conductive carrier 102, here embodied as a leadframe made of copper, of the package 100.

The package 100 comprises the electrically conductive carrier 102, the electronic component 104 (which is here embodied as a power semiconductor chip, for instance comprising an insulated gate bipolar transistor (IGBT)) adhesively (see reference numeral 136) mounted on the carrier 102, and an encapsulant 106 (here embodied as mold compound) encapsulating part of the carrier 102 and part of the electronic component 104. As can be taken from FIG. 1, a pad on an upper main surface of the electronic component 104 is electrically coupled to the carrier 102 via a bond wire 111.

During operation of the power package 100, the electronic component 104 embodied as power semiconductor chip generates a considerable amount of heat. At the same time, it must be ensured that any undesired current flow between a bottom surface of the package 100 and an environment is reliably avoided.

For ensuring electrical insulation of the electronic component 104 and efficiently removing heat from the electronic component 104 in an interior of the package 100 towards an environment, an electrically insulating and thermally conductive interface structure 108 is provided which covers an exposed surface portion of the carrier 102, which surface portion is exposed with respect to the encapsulant 106. Moreover, the interface structure 108 also covers a connected surface portion of the encapsulant 106 at the bottom of the package 100 surrounding said exposed surface portion of the carrier 102. The electrically insulating property of the layer-shaped interface structure 108 prevents an undesired current flow even in the presence of high voltages between an interior and an exterior of the package 100. The thermally conductive property of the interface structure 108 promotes a removal of heat from the electronic component 104, via the electrically conductive carrier 102 (of thermally properly conductive copper), through the interface structure 108 and towards an attachable heat dissipation body 112. The heat dissipation body 112, which may be made of a highly thermally conductive material such as copper or aluminium, serves as a heat sink, has a base body 113 directly connected to the interface structure 108 and has a plurality of cooling fins 116 extending from the base body 113 and in parallel to one another so as to remove the heat towards the environment. A mechanically soft and compressible property of the interface structure 108 ensures that when the heat dissipation body 112 is mounted on the package 100 (for instance by a screw connection or by a clip, not shown), the interface between the interface structure 108 and the heat dissipation body 112 introduces only a small thermal resistance.

However, said mechanically soft and compressible property of the interface structure 108 renders the interface structure 108 also prone to damage, such as scratching, in the event of a mechanical impact.

As shown schematically in FIG. 1 as well and in order to overcome the aforementioned shortcoming, the package 100 may comprise a detachable protection cap 110. In the configuration according to FIG. 1, the protection cap 110 is shown in a detached configuration. The protection cap 110 is provided separately from package body 199, which encompasses in particular carrier 102, electronic component 104 and encapsulant 106. When the package body 199 is separate from the dissipation body 112, it is possible to slide the tubular protection cap 110 (in the embodiment of FIG. 1 with open top and bottom) over the package body 199 so that a through hole 198 extending axially through the protection cap 110 serves as an accommodation volume for at least part of the package body 199. Hence, in the attached configuration of the protection cap 110 (not shown in FIG. 1), the tubular protection cap 110 covers the interface structure 108 and also the encapsulant 106 in a protecting way. As a result, the protection cap 110 mechanically protects in particular the interface structure 108 against undesired damage such as scratching when the protection cap 110 is protectively slid over the package body 199. However, the illustrated sleeve-like protection cap 110 is configured for being reversively removable from the interface structure 108 for exposing the latter. In this exposed configuration, the dissipation body 112 may be connected to the now accessible interface structure 108 to create the arrangement as shown in FIG. 1.

In the shown embodiment, the protection cap 110 may consist of an electrically insulating material such as extrudable plastic. In a mounted state of the protection cap 110 on the package body 199, the sleeve-like protection cap 110 fully circumferentially surrounds the lateral surface of the package body 109, more specifically the lateral surface of the encapsulant 106 and the interface structure 108. As shown in FIG. 1, the electrically insulating and thermally conductive interface structure 108 is configured to be attached at an external surface to the heat dissipation body 112 after removing the protection cap 110.

For operating the package 100 in a protection mode, the protection cap 102 may be slid over the interface structure 108 and the encapsulant 106 of the package body 199 for protecting in particular the interface structure 108 before use of the package 100 against mechanical damage such as scratching. Thereafter, for initiating a use mode the package 100, the protection cap 110 may be removed from the interface structure 108 by pulling it apart from the package body 199 for exposing the interface structure 108. Thereafter, the dissipation body 112 may be attached to the now exposed interface structure 108 for subsequent use of the package 100.

When the protection cap 110 is made of an elastically deformable material, a squeezing force may be applied by an operator manually to the protection cap 110 before sliding it onto the package body 199. By squeezing the sleeve-type protection cap 110, the protection cap 110 may be converted into a shape in which its central through hole 198 can accommodate the package body 199. By releasing or removing the squeezing force after the sliding, the operator may automatically fix the protection cap 110 at the package body 199, since the protection cap 110 will move back to its initial force-free shape in which it engages the package body 199 by an automatically created clamping force. This may be accomplished by matching the exterior shape of the package body 199 to the interior shape of the through hole 198 and by selecting thickness and material of the tubular wall of the protection cap 110 appropriately.

Figure 2:
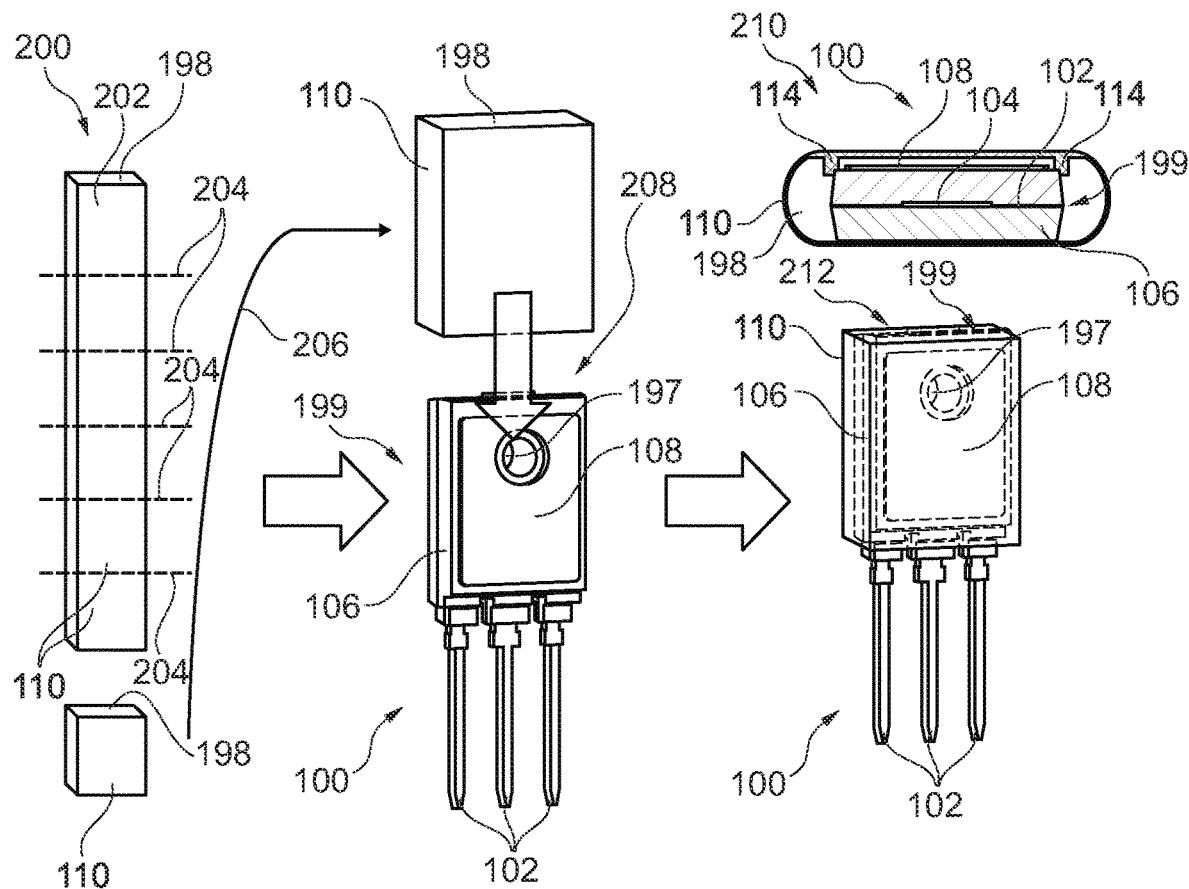
FIG. 2 illustrates different views of structures obtained during carrying out a method of manufacturing a package with protection cap according to an exemplary embodiment.

FIG. 2 illustrates different views of structures obtained during carrying out a method of manufacturing a package 100 with protection cap 110 according to an exemplary embodiment.

As illustrated with reference sign 200, a tubular preform 202 of extruded plastic material with a central through hole 198 is formed by extrusion of plastic material using an appropriate extrusion device (not shown). Thus, the illustrated preform of multiple protection caps 110 may be manufactured efficiently and with low effort by extruding. Thereafter, the tubular preform 202 is separated into a plurality of pieces by cutting at separation lines 204. As a result, a plurality of individual protection caps 110 is obtained. Thus, the manufacturing method comprises separating a tube into multiple protection caps 110, wherein each separated protection cap 110 may be used for protecting a thermal interface structure 108 of an assigned package 100 (see FIG. 1).

For producing package body 199 which is shown in FIG. 2 as well, an electronic component 104 (such as a semiconductor chip) may be mounted on an electrically conductive carrier 102, for instance a leadframe. Thereafter, part of the carrier 102 and the electronic component 104 may be encapsulated by a mold-type encapsulant 106. A connection structure 197, here embodied as a connection hole, may be formed at or in the package body 199. The connection structure 197 may be configured for connecting the package 100 or part thereof to another physical structure, for instance by a connection screw or a connection bolt extending through the connection hole. A surface portion of the carrier 102, which remains exposed after encapsulation, may be covered with electrically insulating and thermally conductive interface structure 108.

A manufactured protection cap 110 (see reference sign 206) may be slid over package body 199 (see reference sign 208). By the described sliding motion, the sensitive interface structure 108 may be mechanically protected by the protection cap 110.

A cross-sectional view 210 of the package 100 composed of package body 199 and protection cap 110 also illustrates a guide structure 114 in the interior of the protection cap 110. In the illustrated embodiment, the guide structure 114 is configured as two parallel guide rails integrally formed with the protection wall at an interior of the protection cap 110. Said guide structure 114 is configured for guiding the package body 199 along a target trajectory up to a target position when being inserted into the accommodation volume or through hole 198 in the interior of the protection cap 110. As a result, the three-dimensional view of package 100 according to FIG. 2 is obtained.

Concluding, a plastic tube (which may be obtained from an extrusion process) may be provided with a desired profile and may be trimmed into a desired length to be rendered appropriate for use as protection cap 110 for package body 199. The package body 199 may be inserted into through hole 198 of the protection cap 110 for activating the protection. As illustrated with reference sign 212, a top side of the package body 199 may remain exposed when the tubular protection cap 110 is slid over the package body 199.

FIG. 3 to FIG. 8 illustrate different views of packages 100 with slidable and removable protection cap 110 according to exemplary embodiments.

Figure 3:
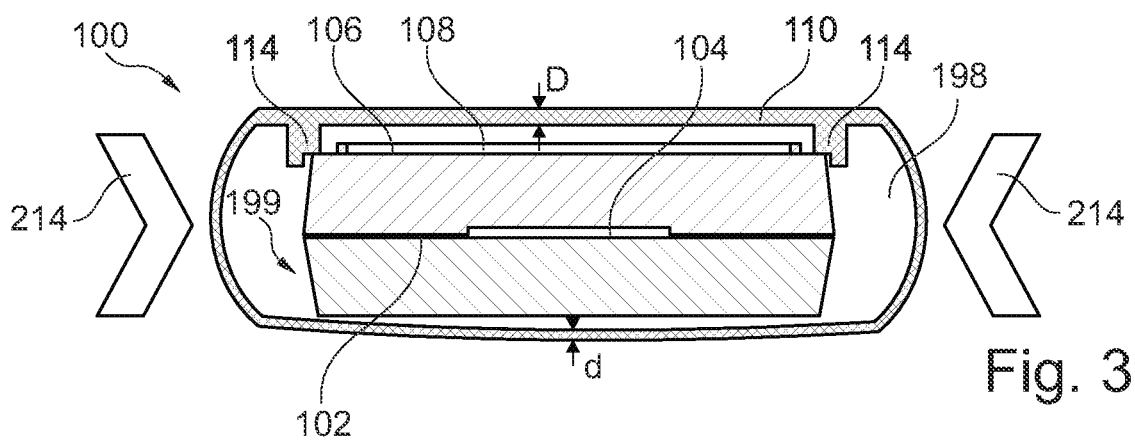

Referring to FIG. 3, a package 100 is illustrated to which a mounting force (see reference signs 214) is presently applied on two opposing lateral sides of the tube-shaped protection cap 110. According to the embodiment of FIG. 3, the lower wall of the protection cap 110 is thinner than the upper wall and will therefore predominantly deform in the presence of the mounting force. More specifically, a wall thickness D of the protection cap 110 on the interface structure 108 may be larger than another wall thickness d of the protection cap 110 on the opposing main surface of the package body 199, which opposing main surface is defined or delimited exclusively by the encapsulant 106. A bigger opening or accommodation space will be created as a consequence of the applied mounting force and may allow the package body 199 to slide into the accommodation space defined by through hole 198.

Figure 4:
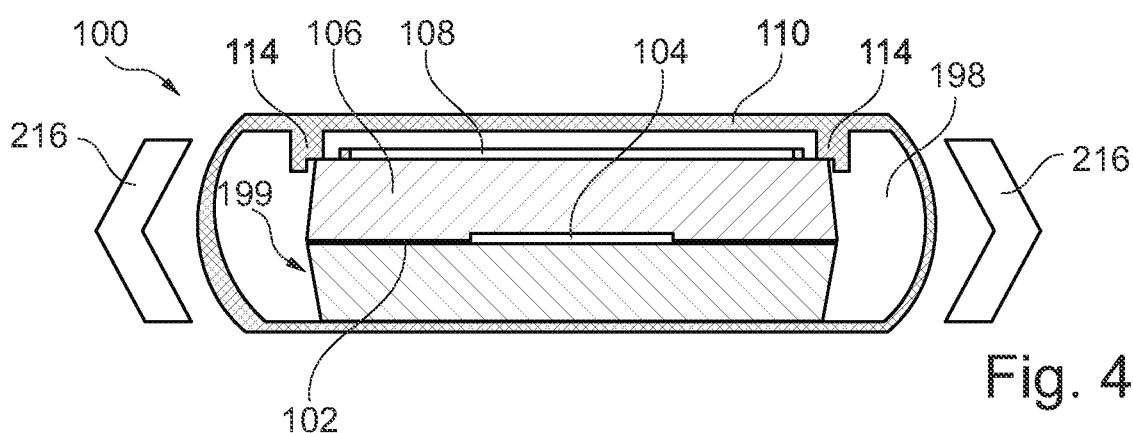

As illustrated in FIG. 4, after the package body 199 has been mounted at least partially within protection cap 110, it is possible to release the (in particular manually) applied mounting force, as illustrated by reference signs 216. As a result, the previously elastically deformed protection cap 110 will return to its original shape and thereby hold the package body 199. In order to remove the protection cap 110 from the package body 199, the force 214 illustrated in FIG. 3 may be applied again to terminate application of a clamping force. In order to enable the described operation, the protection cap 110 may be made of an elastically deformable plastic material.

FIG. 3 and FIG. 4 also show a guide structure 114, which is here configured as two parallel guide rails, for guiding edge portions of the encapsulant 106 of package body 199 inside the accommodation volume in an interior of the protection cap 110. The guide structure 114 is formed in an interior of the protection cap 110 for ensuring a proper positioning of the package body 199 within the protection cap 110. More specifically, the guide structure 114 is formed at the inner wall surface of the protection cap 110. Guide structure 114 is here configured as two parallel aligned guide rails for engaging edges of the package body 199 during assembly and disassembly.

Figure 5:
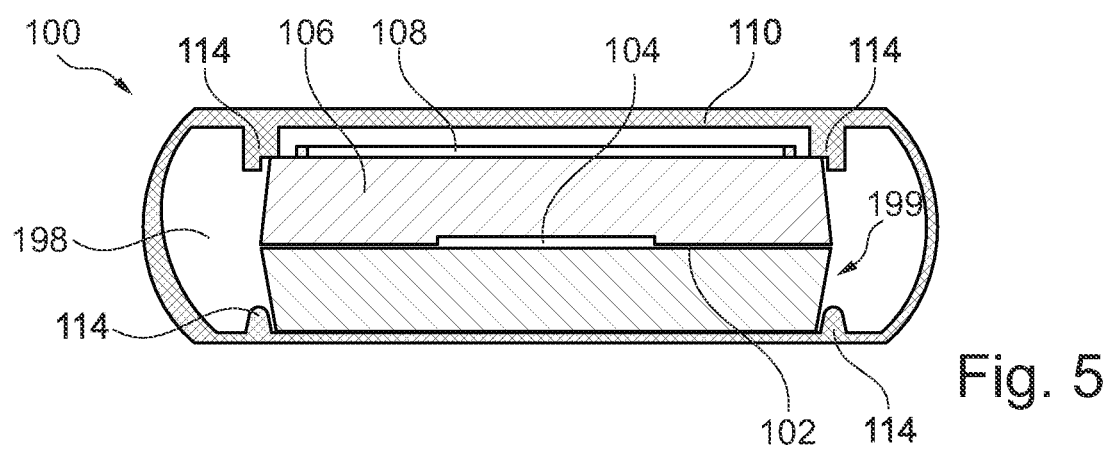

Referring to FIG. 5, a protection cap 110 according to another exemplary embodiment is shown which differs from the embodiment of FIG. 3 and FIG. 4 in particular in that guide structures 114 are formed at four different positions at an interior surface of the protection cap 110. Descriptively speaking, the four guide structures 114 according to FIG. 5 are formed as guide rails engaging four edge portions of the encapsulant 106 of package body 199. This configuration may ensure a highly accurate definition of the position of the package body 199 in an interior of the protection cap 110. In other words, top and bottom guide structures 114 are foreseen at the protection cap 110 of FIG. 5.

Figure 6:
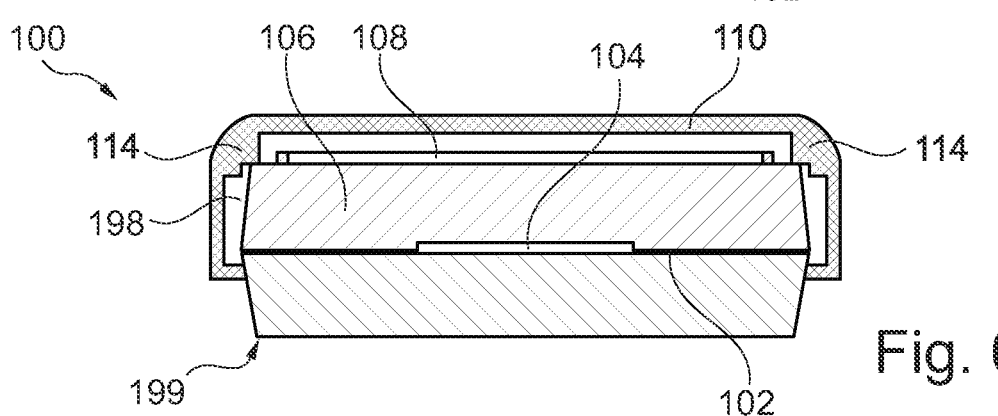
Figure 20:
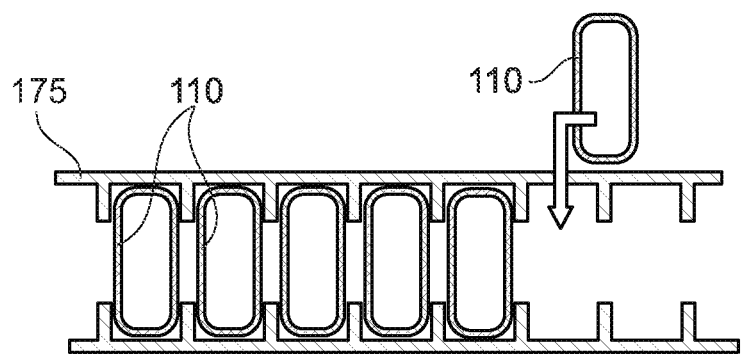
FIG. 20 to FIG. 23 illustrate protection caps according to an exemplary embodiment assembled on a jig and being stored in an external transport tube after being mounted on a respective package body.
Figure 21:
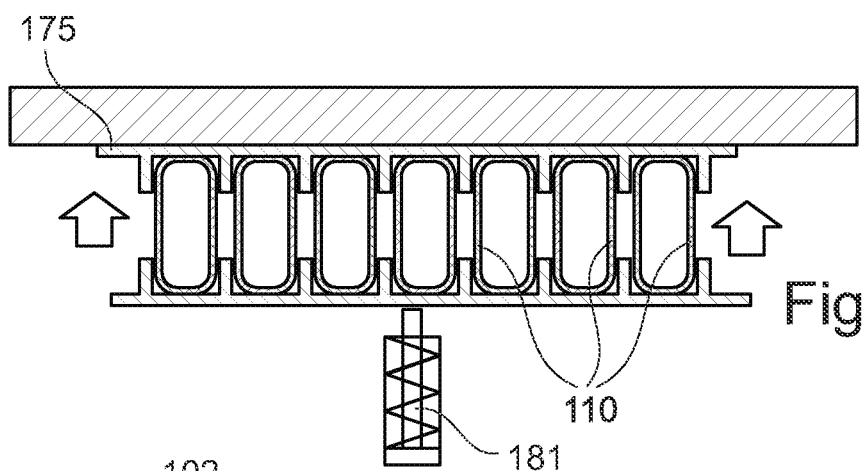
Figure 22:
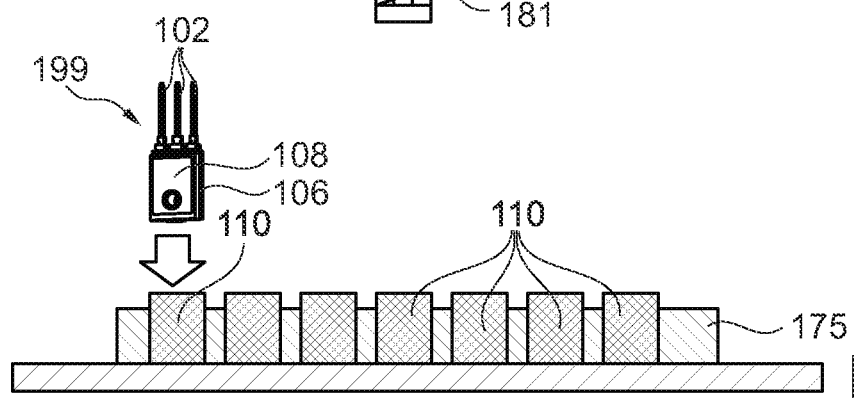
Figure 23:
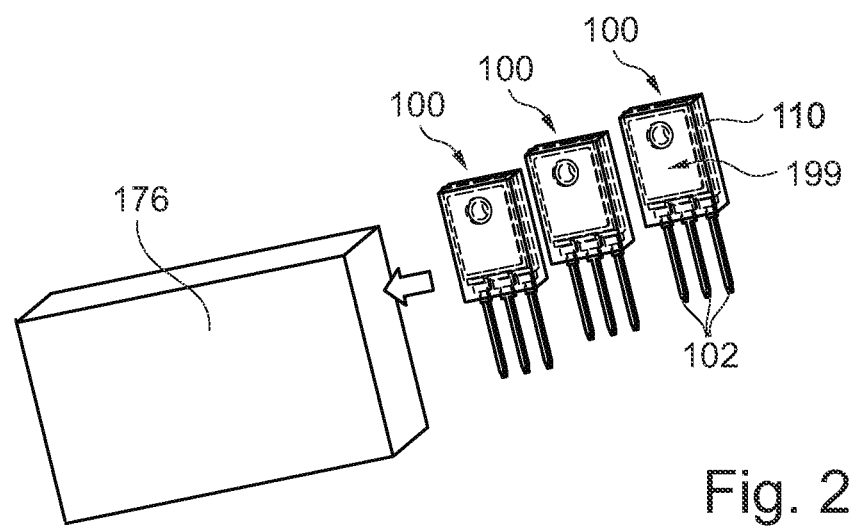

Referring to FIG. 6, a protection cap 110 according to another exemplary embodiment is illustrated in a cross-sectional view. In such an embodiment, the protection cap 110 only partially circumferentially surrounds the encapsulant 106 and the interface structure 108. Descriptively speaking, the cross-sectional view of the protection cap 110 of FIG. 6 is substantially C-shaped. Said protection cap 110 engages two opposing sides of the package body 199 by gripping or clamping. The described configuration of the protection cap 110 of FIG. 6 has the advantage that it can be manufactured with very low material consumption. Furthermore, the protection cap 110 may be easily handled by an operator who only needs to grip the two opposing free ends of the C-shaped protection cap 110 for disassembling the latter from package body 199. The protection cap 110 of FIG. 6 is embodied as a half body protector for selectively covering the interface structure 108. As shown in FIG. 6, also the circumferentially open seashell-like configuration of the protection cap 110 may be provided with guide structures 114 arranged in a similar way as according to FIG. 3 and FIG. 4.

Referring to FIG. 7, yet another exemplary embodiment of a protection cap 110 is illustrated. In this embodiment, protection cap 110 is designed as a hollow circular cylindrical tube, and thus with very simple measures. Hence, the protection cap 110 may also have a round shape in a cross-sectional view.

Referring to FIG. 8, yet another embodiment of a protection cap 110 is illustrated which differs from the embodiment of FIG. 7 in that the cross-sectional view of the protection cap 110 is oval rather than circular.

FIG. 9 and FIG. 10 illustrate different views of a package 100 with overmolded protection cap 110 according to another exemplary embodiments. In such embodiments, the protection cap 110 may be integrally bonded with the interface structure 108 in the encapsulant 106, for instance may be molded on the interface structure 108. Correspondingly, the manufacturing method may comprise overmolding the interface structure 108 with a mold-type protection cap 110.

Referring to FIG. 9, a configuration of the protection cap 110 is illustrated in which it is embodied as a 5-sided cap covering the entire mold, except at a lead side 218 at which leads 220 of carrier 102 extend beyond the encapsulant 106.

Referring to FIG. 10, a 4-sided or 5-sided protection cap 110 is shown which covers a layer-type thermal interface structure 108.

FIG. 11 to FIG. 15 illustrate different views of structures obtained during carrying out a method of manufacturing a package 100 with protection cap 110 according to still another exemplary embodiment. FIG. 11 to FIG. 15 illustrate procedures of capping a thermal interface structure 108 of a package body 199 for providing a mechanical protection against scratching and other damages of the sensitive thermal interface structure 108 (and/or of other substructures of package 100).

Referring to FIG. 11, a plastic tube 112 is provided as a basis for manufacturing multiple protection caps 110. The cross-section of tube 112 may be selected in accordance with a specific package type, for instance a TO-design.

Referring to FIG. 12, the tube 112 may be separated (for example cut) in multiple pieces, for instance in 30 pieces. Each piece may form a separate protection cap 110.

Referring to FIG. 13, a human operator 222 may carry out a manual capping procedure of capping each individual package body 199 with an assigned protection cap 110. For instance, this may be carried out prior to a final tubing process.

Referring to FIG. 14 and reference sign 224, the user or operator may squeeze a respective protection cap 110 before capping to open the sides of the protection cap 110 which simplifies capping on the respective package body 199.

Referring to FIG. 15, the squeezing force may be released or relaxed after capping is completed. As a consequence, the protection cap 110 engages the package body 199 in a self-clamping way. Thereby, the plastic protection cap 110 protects the thermal interface structure 108 which may be embodied as a soft TIM layer. Before use or operation of the package 100, an operator may remove the protection cap 110 from the package body 199 with an inverse handling scheme as described for the capping.

FIG. 16 illustrates a package body 199 covered by a protection cap 110 with a locally thickened protection wall 194 in physical contact with an interface structure 108 according to an exemplary embodiment. More specifically, the protection cap 110 covers the interface structure 108 with physical contact to substantially the entire interface structure 108. According to FIG. 16, the protection cap 110 is designed so that there is no gap between the soft interface structure 108 and the protection cap 110. In the shown embodiment, the protection cap 110 may be made of plastic, such as polyvinylchloride, polycarbonate, etc. When the protection cap 110 is alternatively made of a highly thermally conductive metal (such as aluminum), the protection cap 110 can remain permanently connected to the package body 199.

FIG. 17 illustrates a package body 199 covered by a protection cap 110 with a locally thickened protection wall 194 being arranged in a touchless way with respect to an interface structure 108 according to an exemplary embodiment. According to FIG. 17, the protection cap 110 covers the interface structure 108 without physical contact to the interface structure 108. For instance, a gap, d, between an exterior surface of the interface structure 108 and in inner surface of the protection cap 110 may be in a range between 50 μm and 1 mm.

FIG. 18 illustrates a package body 199 covered only along a part of its circumference by a protection cap 110 according to an exemplary embodiment.

FIG. 19 illustrates part of a protection cap 110 with a predetermined breaking point 173 according to an exemplary embodiment. Thus, the protection cap 110 has a predetermined breaking point 173 configured for breaking when applying a braking force to the protection cap 110. The provision of a locally mechanically weakened predetermined breaking point 173 allows an easy and predictable removal of the protection cap 110 from a package body 199 by cracking the protection cap 110 selectively at the predetermined breaking point 173.

FIG. 20 to FIG. 23 illustrate protection caps 110 according to an exemplary embodiment assembled on a jig 175 or at other mounting structure and being finally stored in an external transport tube 176 after being mounted on a respective package body 199. According to FIG. 20, protection caps 110 are loaded into jig 175. According to FIG. 21, the protection caps 110 are opened for assembly with respective package bodies 199 by an actuator 181. According to FIG. 22, package bodies 199 are loaded into the opened protection caps 110 in the jig 175. According to FIG. 23, correspondingly obtained packages 100 (which may be denoted as internal transfers capsules) may be inserted into an external transport tube 176, for instance for further processing or further handling or for transport purposes.

Figure 24:
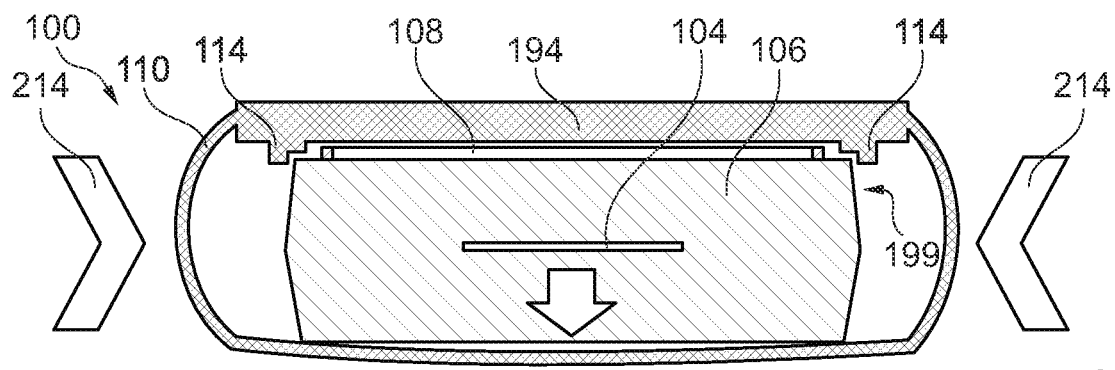
FIG. 24 and FIG. 25 illustrate assembly of a package body with an interface structure covered by a protection cap in a full surface touching way according to an exemplary embodiment.
Figure 25:
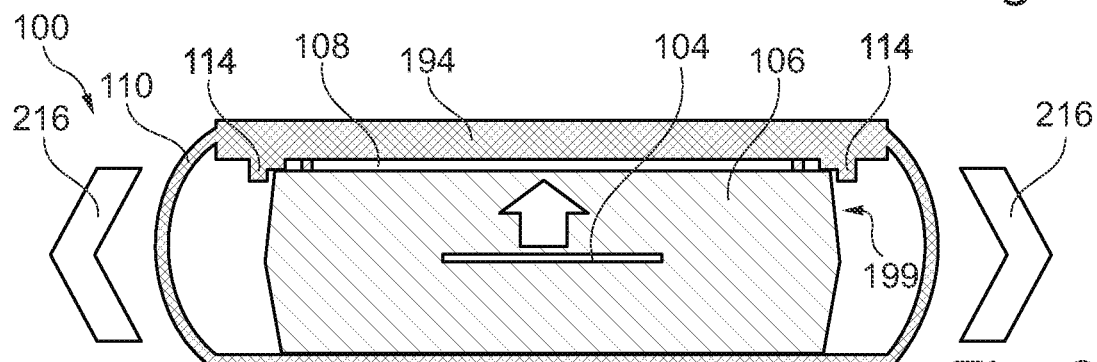

FIG. 24 and FIG. 25 illustrate an assembly of a package body 199 with an interface structure 108 covered by a protection cap 110 in a touching way according to an exemplary embodiment. In such a no gap-configuration, the protection cap 110 may be opened by applying mechanical pressure, as shown in FIG. 24. For this purpose, the sides of the protection cap 110 may be pushed to open, and the package body 199 may be aligned to the bottom and may slide in. As shown in FIG. 25, the externally applied pressure may then be released to close the protection cap 110 so that the inner wall of the protection cap 110 is in full surface contact with the interface structure 108. By such a full surface contact, a risk of damage of the interface structure 108 by scratching due to excessive force peaks may be reduced. In contrast to this, the full surface contact may distribute the forces over a large surface of the interface structure 108.

Figure 26:
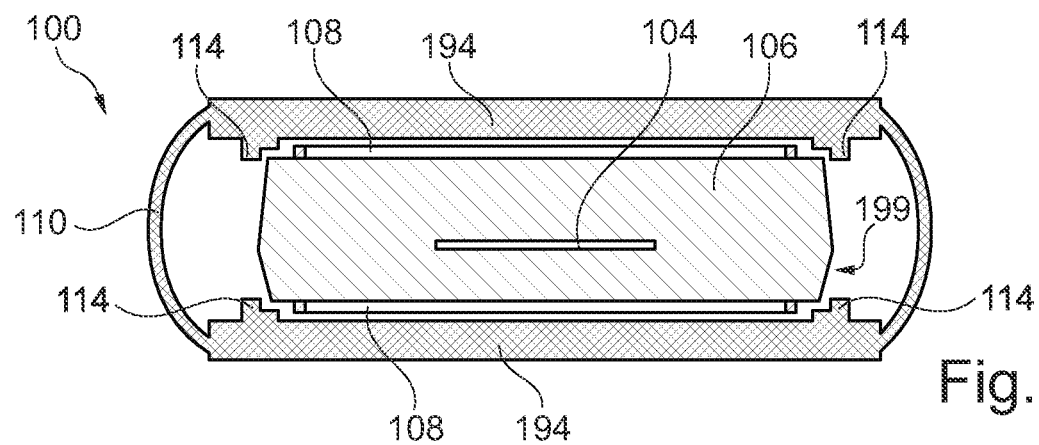
FIG. 26 illustrates a package body with two interface structures for double-sided cooling covered by a protection cap according to an exemplary embodiment.

FIG. 26 illustrates a package body with two interface structures 108 for double-sided cooling covered by a single protection cap 110 according to an exemplary embodiment. In other words, interface structures 108 may be provided on both opposing main surfaces of the package body 199 as shown in FIG. 26. Thereby, heat may be guided out of the package 100 particularly efficiently from both opposing main surfaces of the package 100. Both interface structures 108 are protected by a common single protection cap 110, i.e. by two opposing walls thereof. In order to assemble the package body 199 in the protection cap 110, it is possible to push the side of the protection cap 110 to open it, and to subsequently slide in the package body 199 into the spatially extended protection cap 110.

Figure 27:
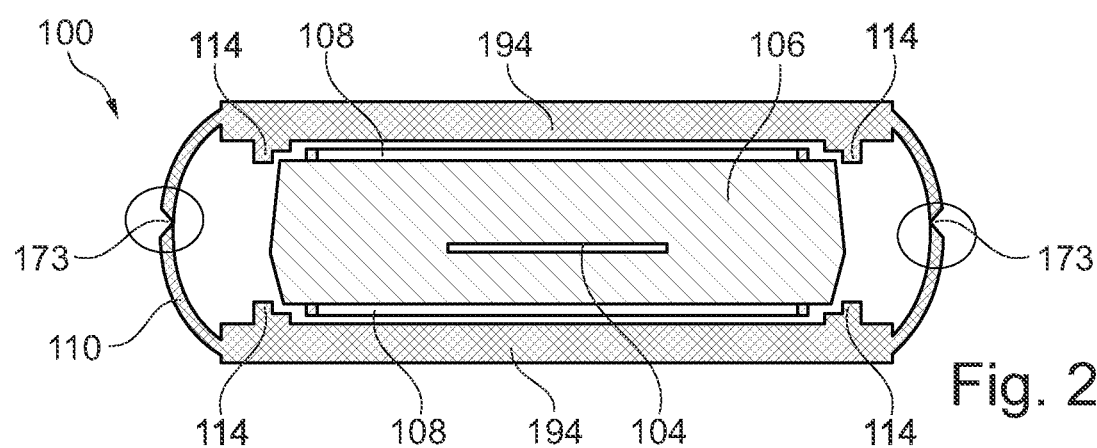
FIG. 27 illustrates a protection cap with predetermined breaking points according to an exemplary embodiment.

FIG. 27 illustrates a protection cap 110 with predetermined breaking points 113 at two lateral side of the protection cap 110 according to an exemplary embodiment. The predetermined breaking points 173 are locally weakened portions of the sidewalls of the protection cap 110. This allow for opening the protection cap 110 at a reasonable force without destroying the predetermined breaking points 113, and it also allows to break the protection cap 110 at the predetermined breaking points 173 on purpose when the force exceeds a predetermined threshold value.

Figure 28:
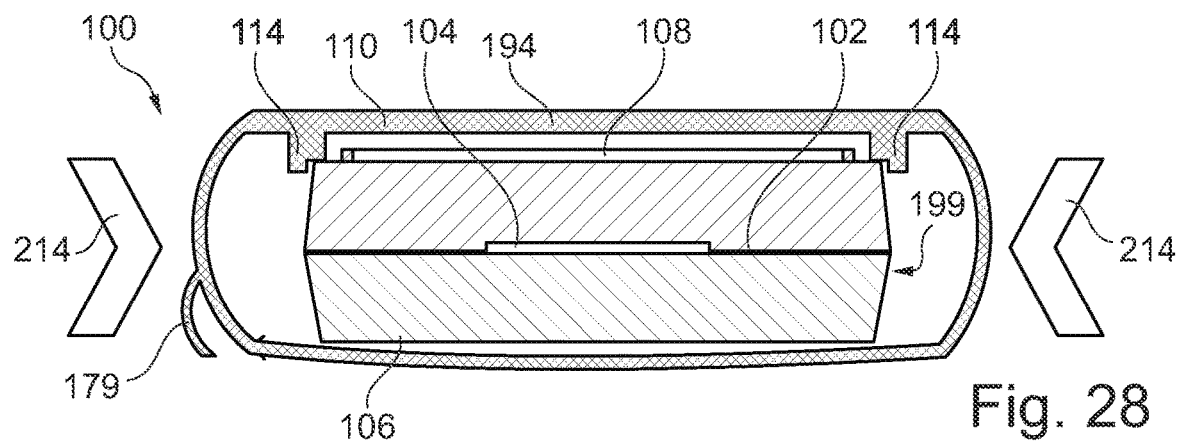
FIG. 28 illustrates a protection cap during assembly with a removal trigger structure configured as tab according to an exemplary embodiment.
Figure 29:
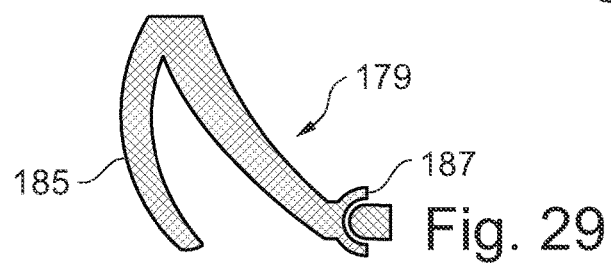
FIG. 29 illustrates the tab according FIG. 28.
Figure 30:
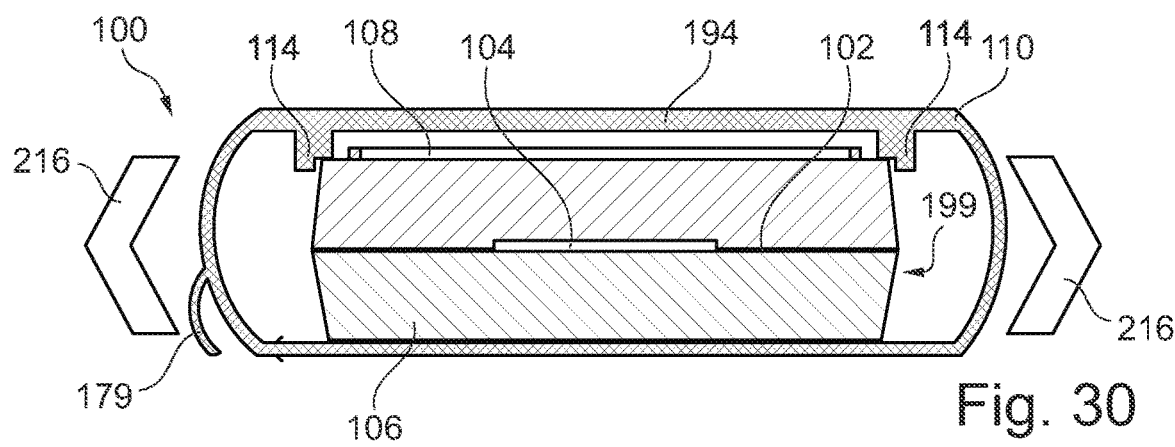
FIG. 30 illustrates the protection cap according to FIG. 28 and FIG. 29 during disassembly.
Figure 31:
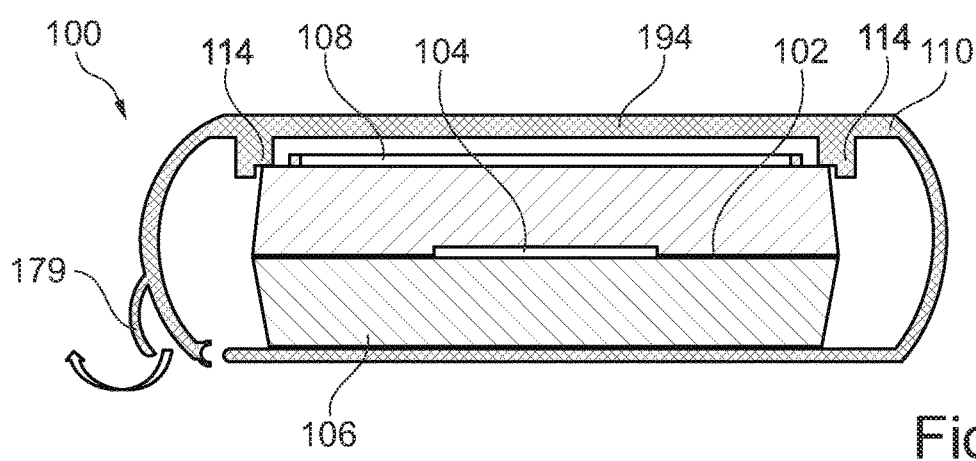
FIG. 31 illustrates the tab of FIG. 28 to FIG. 30 in an open configuration.

FIG. 28 illustrates a protection cap 110 during assembly with a removal trigger structure 179 configured as tab according to an exemplary embodiment. In other words, the protection cap 110 comprises a removal trigger structure 179, in particular a tab, configured for triggering removal of the protection cap 110 from the package body 199. FIG. 29 illustrates a detail of the tab according FIG. 28. FIG. 30 illustrates the protection cap 110 according to FIG. 28 and FIG. 29 during disassembly. FIG. 31 illustrates the tab of FIG. 28 to FIG. 30 in an open configuration. Thus, FIG. 28 to FIG. 31 shows operation of a protection cap 110 having a pull tab for removal. As shown in FIG. 29, the tab-type removal trigger structure 179 is opened at structure 185 and has a locking mechanism 187 which can be unlocked by operating or actuating structure 185. According to FIG. 28, the protection cap 110 is pushed at a side to place package body 199 therein. Thereafter, the assembly force is released to hold the package body 199 within the protection cap 110 in place (compare FIG. 30). As shown in FIG. 31, the tab may be pulled to open the protection cap 110 after installation of the package body 199 in the protection cap 110 to release the latter. Descriptively speaking, pulling at the removal trigger structure 179 breaks the tab-type protection cap 110.

Figure 32:
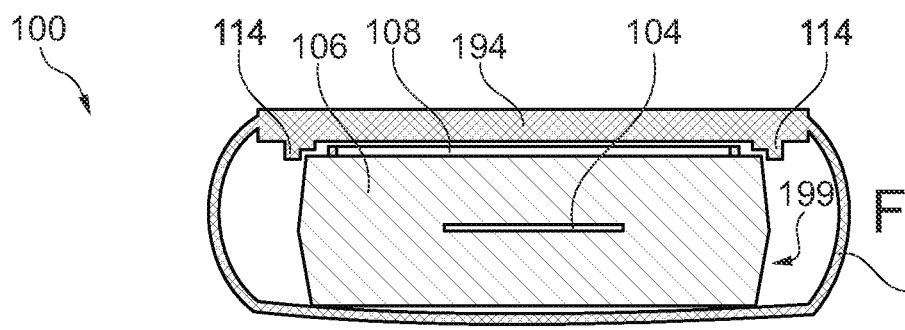
FIG. 32 illustrates a protection cap during thermally triggered assembly according to an exemplary embodiment.

FIG. 32 illustrates a protection cap 110 during thermally triggered assembly according to an exemplary embodiment. In this embodiment, the protection cap 110 is configured for thermally triggering assembly and/or disassembly of the protection cap 110 on the package 100. For instance, the capsule-type protection cap 110 of FIG. 32 opens in a self-sufficient way at a predetermined elevated temperature (for instance when heated to a predetermined elevated temperature above ambient temperature, the elevated temperature for instance being in a range between 25° C. and 200° C.). A temperature increase may then be a sufficient trigger for removing the protection cap 110.

Figure 33:
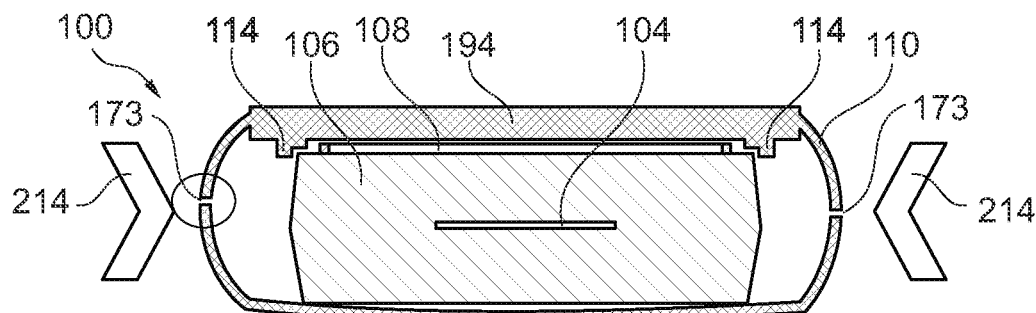
FIG. 33 illustrates a protection cap with predetermined breaking points according to an exemplary embodiment.

FIG. 33 illustrates a protection cap 110 with a predetermined breaking point 173 according to an exemplary embodiment. Applying a side force cracks the plastics capsule-type protection cap 110 for releasing the package body 199.

Figure 34:
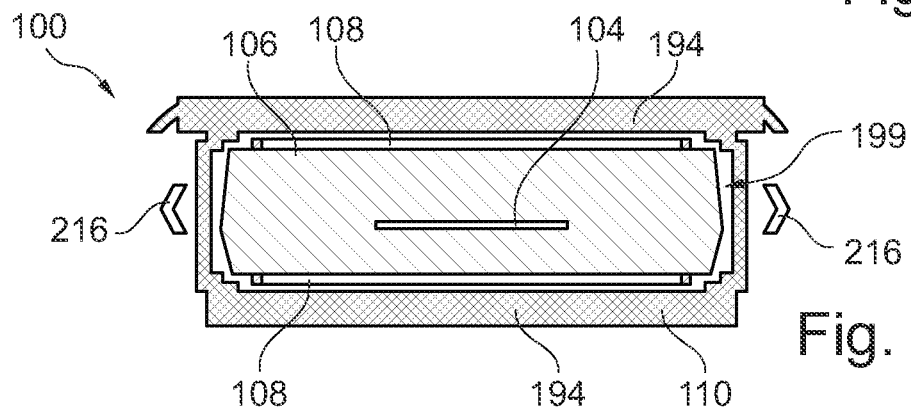
FIG. 34 illustrates a protection cap during thermally triggered assembly according to an exemplary embodiment.

FIG. 34 illustrates a protection cap 110 during thermally triggered assembly according to an exemplary embodiment. A temperature increase (for instance up to a predetermined temperature which may be in the range from 25° C. to 200° C.) will act on the protection cap 110 and will apply a thermal assembly force 216 thereon to open the protection cap 110. Thereafter, the package body 199 may be assembled within the thermally opened protection cap 110. After said loading procedure, the temperature increase may be released (i.e. the package 100 may be cooled down actively or passively to ambient temperature), which will automatically trigger a connection force between package body 199 and protection cap 110.

Figure 35:
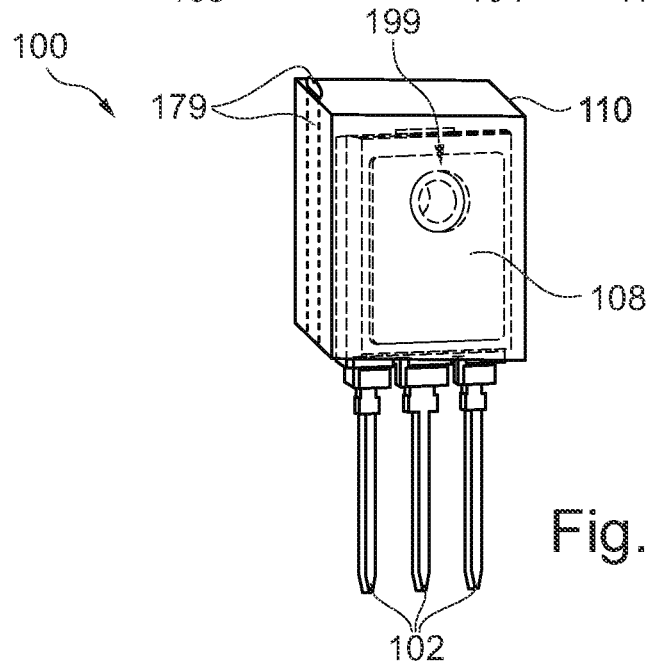
FIG. 35 illustrates a protection cap with a tear-off zipper according to an exemplary embodiment.

FIG. 35 illustrates a protection cap 110 with a removal trigger structure 179, in particular a tear-off zipper, according to an exemplary embodiment. FIG. 35 thus shows that a zipper may be integrated in a wall of the protection cap 110. After having assembled a protection cap 110 with a package body 199, the protection cap 110 may be removed by actuating the zipper-type removal trigger structure 179.

FIG. 36 to FIG. 39 illustrate protection caps 110 according to an exemplary embodiment during automated robot handling. More specifically, FIG. 36 to FIG. 38 illustrate a robot 189 operating the package 100. Robot 189 has a first robot part 191 and a second robot part 193. According to FIG. 36 and FIG. 37, a capsule-type protection cap 110 is pulled-off from a package body 199 by robot 189. According to FIG. 38, robot 189 pushes out capsule-type protection cap 110.

Figure 39:
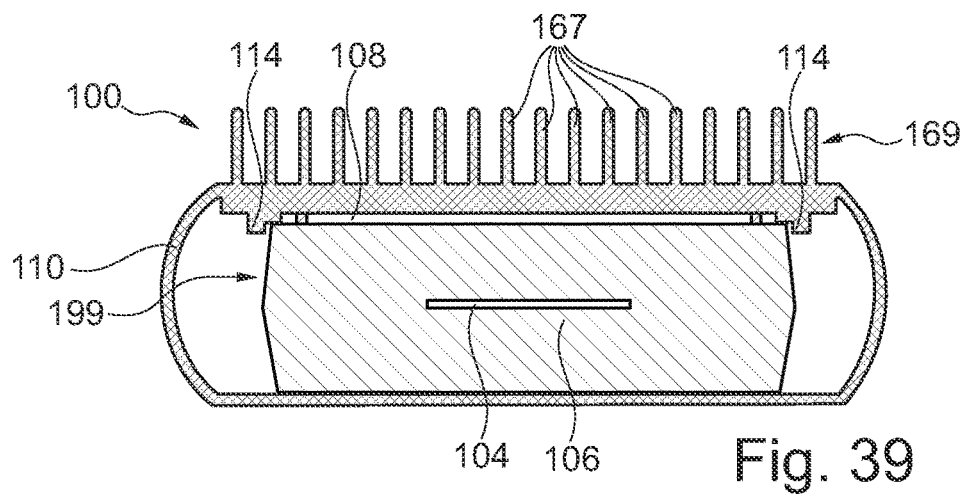

According to FIG. 39, a protection cap 110 with integrated heat sink 169 is illustrated. Descriptively speaking, the embodiment of FIG. 39 relates to a protector with extended heat sink 169. This provides a damage protection of surfaces of the corresponding package 100, wherein in this embodiment the protection cap 110 also serves as heat sink 169 to dissipate package heat. More specifically, a thermally conductive path is established from the encapsulated component 104 via carrier 102, interface structure 108 up to the protection cap 110 with the heat sink 169 formed on an exterior side of the protection cap 110. Hence, the protection cap 110 of FIG. 39 also fulfils a cooling function. Preferably, the cap material is heat or thermally conductive (a high voltage insulation may be provided by the package 100). The protection cap 110 may be used permanently with the function of heat sink 169. In the illustrated embodiment of FIG. 39, heat sink 169 is provided with a plurality of cooling fins 167 for promoting heat removal. Thus, the protection cap 110 may comprise an integrated heat sink 169.

Figure 40:
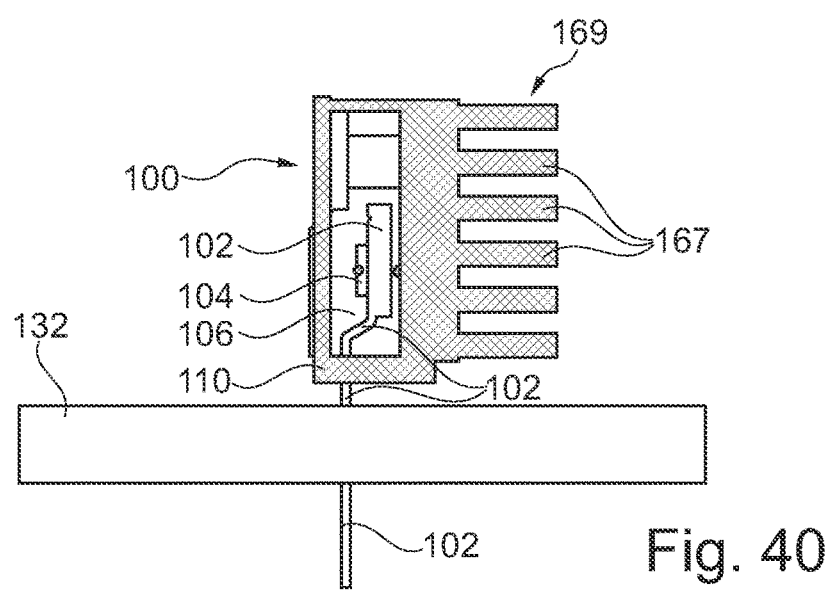
FIG. 40 illustrates a cross-sectional view of a package with protection cap according to another exemplary embodiment, the package being mounted on a mounting structure and having an intrinsic heat dissipation body.

FIG. 40 illustrates a cross-sectional view of a package 100 with protection cap 110 according to another exemplary embodiment, the package 100 being mounted on a mounting structure 132 and having an intrinsic heat dissipation body or heat sink 169. Reference is made to the description of FIG. 1. However, according to FIG. 40, heat sink 169 forms part of the package 100, more specifically forms part of cap 110. Thus, the metallic cap 110 of FIG. 40 acts as heat sink 169 and is not removed during operation of the standing package 100.

Figure 41:
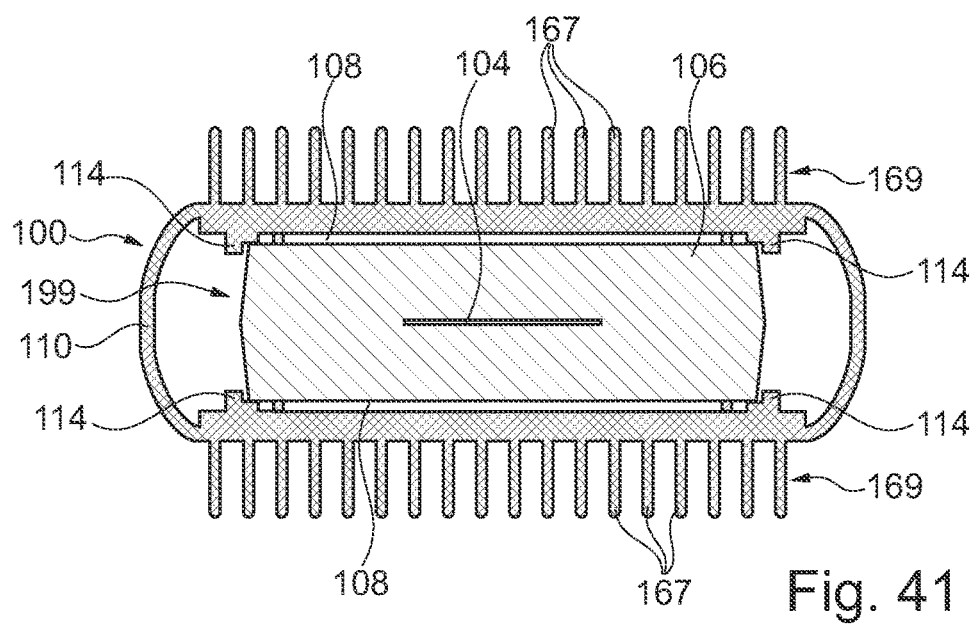
FIG. 41 illustrates a package with reversibly attachable and detachable protection cap with cooling fins on two opposing sides for double-sided cooling according to an exemplary embodiment.

FIG. 41 illustrates a package 100 with reversibly attachable and detachable protection cap 110 with cooling fins 167 on two opposing sides for double-sided cooling according to an exemplary embodiment. The embodiment of FIG. 41 differs from the embodiment of FIG. 39 in that a respective heat sink 169 is provided on each of two opposing sides of the package 100 so as to remove heat to two opposing sides and thus in a very efficient way.

Figure 42:
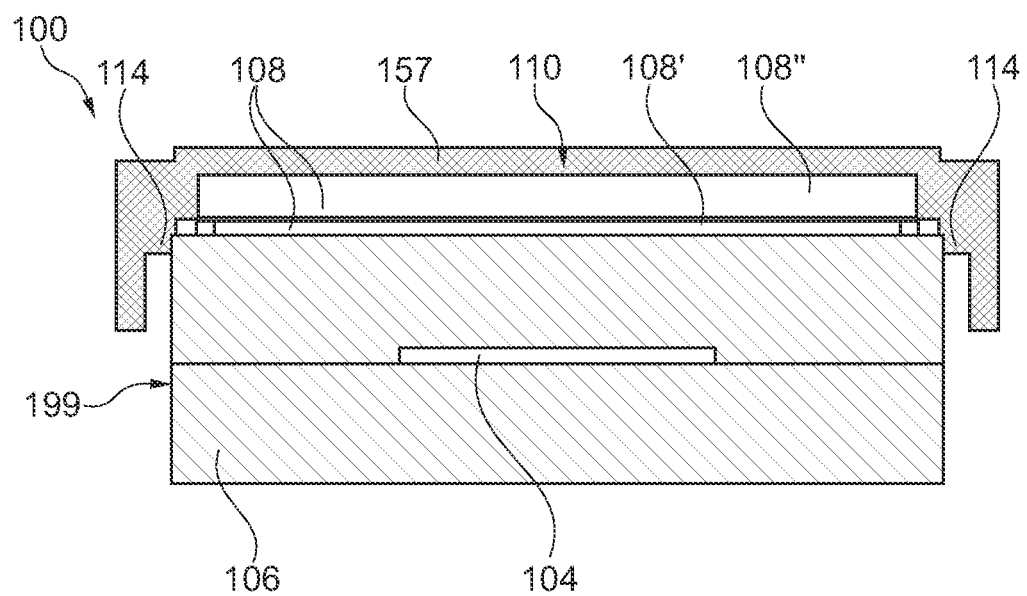
FIG. 42 illustrates a package with reversibly attachable and detachable protection cap having two thermal interface structures according to an exemplary embodiment.

FIG. 42 illustrates a package 100 with reversibly attachable and detachable protection cap 110 having two thermal interface structures or materials 108', 108" according to an exemplary embodiment.

According to FIG. 42 and even more generally, a material of cap 110 can be a metal (providing a high thermal conductivity, and no electrical insulation), a plastic (for providing low or even no thermal conductivity, and a high electrical insulation), or a metal covered with thermal interphase material (heat conductive but electrically insulating).

Again referring to FIG. 42, the cap 110 has an exterior metallic shell 157 (for instance made of aluminium or copper), a first thermal interface material 108' in contact with the package body 199 and a second thermal interface material 108" between the metallic shell 157 and the first thermal interface material 108'. The first thermal interface material 108' may be a soft TIM to protect (for instance thermal grease or phase change material) and is not necessarily electrically insulating. The second thermal interface material 108" may be as well a TIM material (hard or soft) which is electrically insulating and may be pre-applied to the protection cap 110. Thus, the interface structure 108 may comprise two sections of different materials 108', 108".

It should be noted that the term "comprising" does not exclude other elements or features and the "a" or "an" does not exclude a plurality. Also, elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of manufacturing a package, the method comprising:
    mounting an electronic component on an electrically conductive carrier;
    encapsulating part of the carrier and the electronic component by an encapsulant;
    covering an exposed surface portion of the carrier with an electrically insulating and thermally conductive interface structure;
    covering at least part of the interface structure by a protection cap; and
    forming the protection cap by immersion into a cap precursor such that exposed electrically conductive structures of the package are simultaneously covered with the cap precursor.

2. The method of claim 1, further comprising:
    separating a tube into multiple protection caps; and
    using each separated protection cap for an assigned package.

3. The method of claim 1, further comprising:
    forming the protection cap by extruding.

4. The method of claim 1, further comprising:
    overmolding the interface structure to form the protection cap as a mold-type protection cap.

5. A method of operating a package having an electrically conductive carrier, an electronic component on the carrier, an encapsulant encapsulating part of the carrier and the electronic component, an electrically insulating and thermally conductive interface structure covering an exposed surface portion of the carrier, and a protection cap covering at least part of the interface structure, the method comprising:
    sliding the protection cap over the interface structure for protecting the interface structure before use of the package; and
    later removing the protection cap from the interface structure for exposing the interface structure for use of the package.

6. The method of claim 5, further comprising:
    applying a squeezing force to the protection cap before the sliding; and
    removing the squeezing force after the sliding to thereby fix the protection cap.

7. The method of claim 5, further comprising:
    after the removing, attaching the electrically insulating and thermally conductive interface structure to a heat dissipation body.

8. A method of manufacturing a package, the method comprising:
    mounting an electronic component on an electrically conductive carrier;
    encapsulating part of the carrier and the electronic component by an encapsulant;
    covering an exposed surface portion of the carrier with an electrically insulating and thermally conductive interface structure; and
    covering at least part of the interface structure by a protection cap,
    wherein the protection cap is reversibly attachable to and detachable from a package body formed by the carrier, the electronic component, the encapsulant and the interface structure.

\* \* \* \* \*